(12) United States Patent
Takemura

(10) Patent No.: US 8,472,231 B2
(45) Date of Patent: Jun. 25, 2013

(54) SEMICONDUCTOR MEMORY DEVICE

(75) Inventor: Yasuhiko Takemura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 131 days.

(21) Appl. No.: 13/076,787

(22) Filed: Mar. 31, 2011

(65) Prior Publication Data

US 2011/0249484 A1   Oct. 13, 2011

(30) Foreign Application Priority Data

Apr. 7, 2010  (JP) .................................. 2010-088240
Apr. 14, 2010  (JP) .................................. 2010-092709

(51) Int. Cl.
    *G11C 5/06*  (2006.01)
(52) U.S. Cl.
    USPC ................. 365/63; 365/51; 365/65; 365/145; 365/149
(58) Field of Classification Search
    USPC ................. 365/51, 63, 65, 145, 149
    See application file for complete search history.

(56) References Cited

U.S. PATENT DOCUMENTS

| | | | |
|---|---|---|---|
| 4,466,081 A | 8/1984 | Masuoka | |
| 5,220,530 A * | 6/1993 | Itoh | 365/189.14 |
| 5,291,440 A | 3/1994 | Koyama | |
| 5,731,856 A | 3/1998 | Kim et al. | |
| 5,744,864 A | 4/1998 | Cillessen et al. | |
| 6,127,702 A | 10/2000 | Yamazaki et al. | |
| 6,208,559 B1 * | 3/2001 | Tu et al. | 365/185.18 |
| 6,294,274 B1 | 9/2001 | Kawazoe et al. | |
| 6,314,017 B1 * | 11/2001 | Emori et al. | 365/149 |
| 6,445,026 B1 | 9/2002 | Kubota et al. | |
| 6,536,013 B2 | 3/2003 | Kobayashi et al. | |
| 6,563,174 B2 | 5/2003 | Kawasaki et al. | |
| 6,570,206 B1 | 5/2003 | Sakata et al. | |

(Continued)

FOREIGN PATENT DOCUMENTS

| CN | 101258607 A | 9/2008 |
|---|---|---|
| CN | 101859711 A | 10/2010 |

(Continued)

OTHER PUBLICATIONS

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

(Continued)

*Primary Examiner* — Vanthu Nguyen
(74) *Attorney, Agent, or Firm* — Fish & Richardson P.C.

(57) ABSTRACT

An object is to provide a semiconductor memory device which stores data with the use of a transistor having small leakage current between a source and a drain in an off state as a writing transistor. In a matrix including a plurality of memory cells, gates of the writing transistors are connected to writing word lines. In each of the memory cells, a drain of the writing transistor is connected to a gate of a reading transistor, and the drain is connected to one electrode of a capacitor. Further, the other electrode of the capacitor is connected to a reading word line. In the semiconductor memory device in which the memory cells are connected in series so as to have a NAND structure, gates of the reading transistors are provided alternately, and the reading word line and the writing word line are shared.

6 Claims, 22 Drawing Sheets

U.S. PATENT DOCUMENTS

| | | |
|---|---|---|
| 6,727,522 B1 | 4/2004 | Kawasaki et al. |
| 6,873,009 B2 | 3/2005 | Hisamoto et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,411,236 B2 | 8/2008 | Matsuzawa |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,468,901 B2 | 12/2008 | Kameshiro et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,859,889 B2 | 12/2010 | Kameshiro et al. |
| 7,935,582 B2 | 5/2011 | Iwasaki |
| 7,956,361 B2 | 6/2011 | Iwasaki |
| 2001/0046027 A1 | 11/2001 | Tai et al. |
| 2002/0056838 A1 | 5/2002 | Ogawa |
| 2002/0096702 A1 | 7/2002 | Ishii et al. |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2003/0227041 A1 | 12/2003 | Atwood et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0128803 A1 | 6/2005 | Luk et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |
| 2011/0101351 A1 | 5/2011 | Yamazaki |
| 2011/0122673 A1 | 5/2011 | Kamata et al. |
| 2011/0134683 A1 | 6/2011 | Yamazaki et al. |
| 2011/0156028 A1 | 6/2011 | Yamazaki et al. |
| 2011/0198593 A1 | 8/2011 | Kato et al. |
| 2011/0210339 A1 | 9/2011 | Yamazaki et al. |
| 2011/0216571 A1 | 9/2011 | Yamazaki et al. |
| 2011/0228584 A1 | 9/2011 | Takemura |
| 2011/0260158 A1 | 10/2011 | Takemura |

FOREIGN PATENT DOCUMENTS

| | | |
|---|---|---|
| EP | 0 469 554 A2 | 2/1992 |
| EP | 1 737 044 A1 | 12/2006 |
| EP | 2 226 847 A2 | 9/2010 |
| JP | 56-162875 A | 12/1981 |
| JP | 57-105889 A | 7/1982 |
| JP | 60-198861 A | 10/1985 |
| JP | 62-230043 A | 10/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-218960 A | 8/1992 |
| JP | 05-036942 A | 2/1993 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001-053164 A | 2/2001 |
| JP | 2001-053167 A | 2/2001 |
| JP | 2001-351386 A | 12/2001 |
| JP | 2002-076356 A | 3/2002 |
| JP | 2002-093924 A | 3/2002 |
| JP | 2002-094029 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-014094 A | 1/2004 |
| JP | 2004-103957 A | 4/2004 |
| JP | 2004-273614 A | 9/2004 |
| JP | 2004-273732 A | 9/2004 |
| JP | 2007-027393 A | 2/2007 |
| JP | 2007-103918 A | 4/2007 |
| JP | 2010-183108 A | 8/2010 |
| KR | 2002-0021310 A | 3/2002 |
| KR | 10-2008-053355 A | 6/2008 |
| WO | 0070683 A1 | 11/2000 |

| | | | |
|---|---|---|---|
| WO | 2001/073846 A1 | 10/2001 |
| WO | 2004/114391 A1 | 12/2004 |
| WO | 2007/029844 A1 | 3/2007 |
| WO | 2011/108475 A1 | 9/2011 |
| WO | 2011/114905 A1 | 9/2011 |
| WO | 2011/135999 A1 | 11/2011 |

OTHER PUBLICATIONS

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M. et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069

Fortunato, E et al., "Wide-Bandgap High-Mobility ZNO Thin-Film Transistors Produced at Room Temperature," Appl. Phys. Lett. (Applied Physics Letters), Sep. 27, 2004, vol. No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous IN-GA-ZN-Oxide TFT," SID Digest '09 : SID International Symposium Digest of Technical Papers, May 21, 2009, pp. 1110-1112.

Godo, H et al., "Temperature Dependence of Characteristics and Electronic Structure for Amorphous IN-GA-ZN-OXIDE TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Diges '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays,"IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$-$Ga_2ZnO_4$-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline $InGaO_3(ZnO)_5$ films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B. (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)m$ (m<4):a Zn4s conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park. S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$-$In_2O_3$-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report, PCT Application No. PCT/JP2011/056131, dated Jun. 21, 2011, 3 pages.

Written Opinion, PCT Application No. PCT/JP2011/056131, dated Jun. 21, 2011, 5 pages.

* cited by examiner off state when the potential is +3V, +4V, or +5V off state when the potential is +3V off state when the potential is +4V off state when the potential is +4V or +5V off state when the potential is +4V, +5V, or +6V

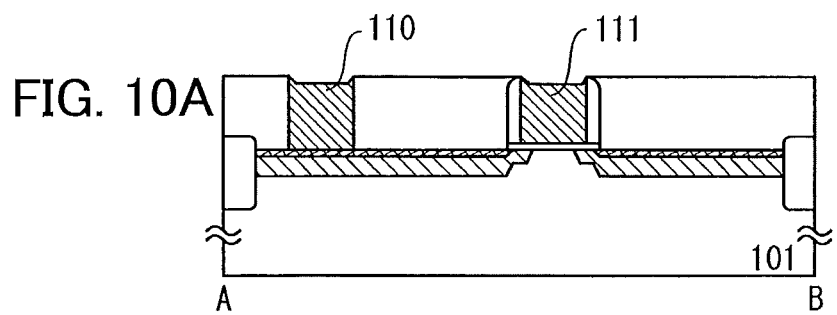
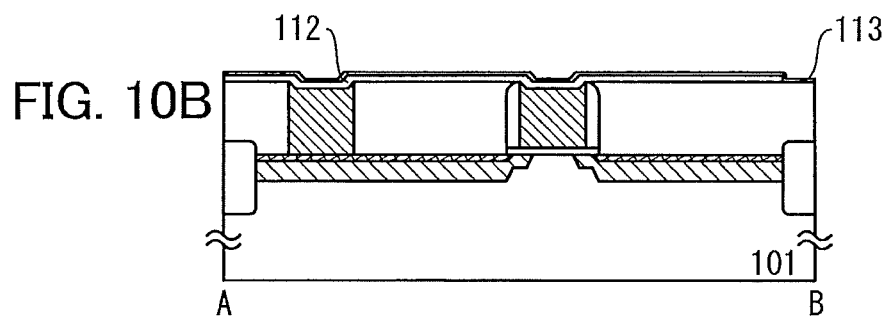
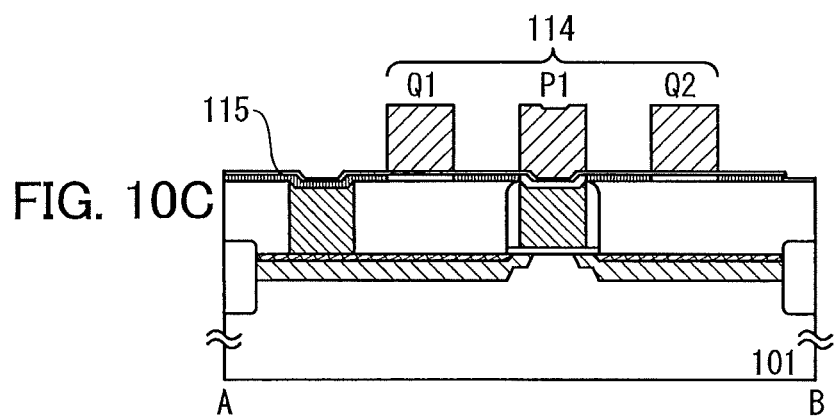
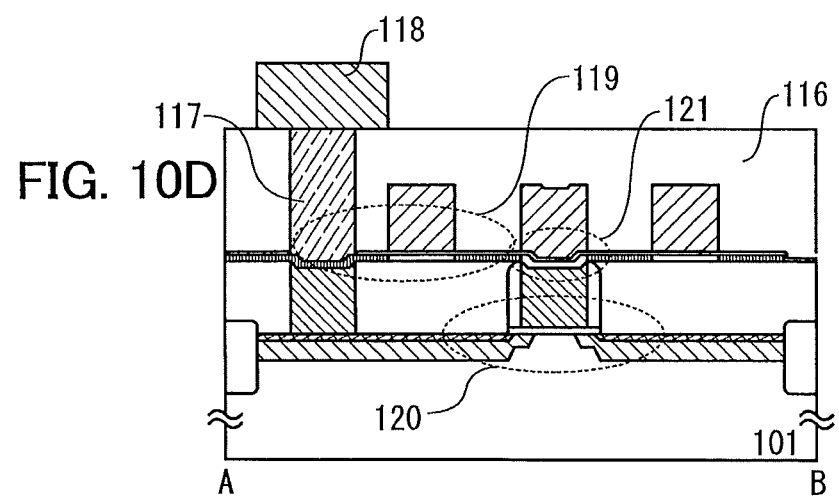

off state when the potential is 0V off state when the potential is -1V or 0V off state when the potential is -2V, -1V, or 0V off state when the potential is 0V off state when the potential is -1V or 0V

SEMICONDUCTOR MEMORY DEVICE

TECHNICAL FIELD

The present invention relates to a memory device using a semiconductor.

BACKGROUND ART

There are many kinds of memory devices using semiconductors. For example, a dynamic random access memory (DRAM), a static random access memory (SRAM), an electrically erasable and programmable read only memory (EEPROM), and a flash memory are given.

In a DRAM, data is stored by holding charge in a capacitor which is provided in a memory cell. However, even when a transistor used for switching is in an off state, a slight amount of leakage current is generated between a source and a drain; thus, the data is lost within a relatively short time (several tens of seconds at the longest). Therefore, the data needs to be rewritten (refreshed) in a certain cycle (generally several tens of milliseconds).

In an SRAM, data is held by utilizing a bistable state of a flip-flop circuit. A CMOS inverter is generally used in a flip-flop circuit of an SRAM. Since six transistors are used in one memory cell, an integration degree of an SRAM is lower than that of a DRAM. In addition, the data is lost when power is not supplied.

On the other hand, in an EEPROM or a flash memory, a so-called floating gate is provided between a channel and a gate and charge is stored in the floating gate, whereby data is held. The charge stored in the floating gate is held even after power supply to a transistor stops, which is why these memories are called nonvolatile memories. For example, Patent Document 1 may be referred to for a flash memory.

In this specification, a memory having a floating gate, examples of which are an EEPROM and a flash memory, is called a floating gate nonvolatile memory (FGNVM). Since data at some stages can be stored in one memory cell in an FGNVM, storage capacity can be large. Further, since the number of contact holes can be significantly decreased in a NAND-type flash memory, an integration degree can be increased to some extent.

However, in a conventional FGNVM, high voltage is needed at the time of injection of charge to a floating gate or removal of the charge. Because of this, deterioration of a gate insulating film cannot be avoided and writing and erasing cannot be repeated without limitation.
[Reference]
[Patent Document]
[Patent Document 1] Japanese Published Patent Application No. S57-105889

DISCLOSURE OF INVENTION

As described above, a conventional semiconductor memory device has good points and bad points and there has been no semiconductor devices meeting sufficiently all necessary conditions. In a memory device, reduction in power consumption is required. When the power consumption is high, the size of a device for supplying power needs to be larger, or an operating time on a battery is shortened. Moreover, a semiconductor element may be heated; thus, the characteristics of the element may be deteriorated, and in some cases, a circuit is damaged. In addition, there is preferably no limitation on the number of rewriting times and it is desirable that rewriting can be performed one billion times or more. Needless to say, a high integration degree is also needed.

In light of these points, a DRAM has difficulty in reducing power consumption because leakage current is generated and refreshing is performed all the time. In an SRAM, there is another problem in that the integration degree cannot be increased because six transistors are included in one memory cell. Moreover, in an FGNVM, although the power consumption and the integration degree do not become a problem, the number of rewriting times is a hundred thousand or less.

In view of the above, it is the first object of one embodiment of the present invention to achieve all the following three conditions: power consumed by a memory cell for holding memory is lower than that in a DRAM; the number of transistors used in one memory cell is five or less; and the number of rewriting times is one million or more. Further, it is the second object to achieve all the following two conditions: data is held without power supply for 10 hours or longer, preferably 100 hours or longer; and the number of rewriting times is one million or more. Note that in this specification, a data holding time is a time needed for the amount of charge held in a memory cell to be decreased to 90% of the initial amount.

In one embodiment of the present invention, in addition to the above objects, it is another object to provide a novel semiconductor device, specifically a novel semiconductor memory device. It is another object to provide a driving method of a novel semiconductor device, specifically a driving method of a novel semiconductor memory device. Further, it is another object to provide a manufacturing method of a novel semiconductor device, specifically a manufacturing method of a novel semiconductor memory device.

Before embodiments of the present invention are described, terms used in this specification will be briefly explained. A source and a drain of a transistor have the same or substantially the same structure and function. Even if the structures are different, in this specification, when one of a source and a drain of a transistor is called a source, the other is called a drain for convenience, and they are not particularly distinguished for the reason that a potential applied to the source or the drain or a polarity of the potential is not definite. Therefore, a source in this specification can be alternatively referred to as a drain.

In this specification, the expression "to be orthogonal to each other (in a matrix)" means not only to intersect with each other at right angles but also to be orthogonal to each other in the simplest circuit diagram even though a physical angle is not a right angle. "To be parallel to each other (in a matrix)" means to be parallel to each other in the simplest circuit diagram even though two wirings are provided so as to physically intersect with each other.

Moreover, even when the expression "connect" is used in this specification, in an actual circuit, there are no physical connecting portions and a wiring is just extended in some cases. For example, in the case of a circuit including an insulated-gate field-effect transistor (MISFET), one wiring functions as gates of a plurality of MISFETs in some cases. In that case, one wiring which branches into gates may be illustrated in a circuit diagram. Even in such a case, the expression "a wiring is connected to a gate" may be used in this specification.

According to one embodiment of the present invention, one memory cell includes a transistor as a writing transistor, in which leakage current between a source and a drain in an off state is small, another transistor (a reading transistor), and a capacitor. The conductivity type of the reading transistor is different from that of the writing transistor. For example, when the writing transistor has n-type conductivity, the reading transistor has p-type conductivity. As a wiring connected to the writing transistor or the reading transistor, three kinds of wirings that are a writing word line, a bit line, and a reading word line are prepared.

A drain of the writing transistor is connected to a gate of the reading transistor and one electrode of the capacitor. Further, a gate of the writing transistor is connected to the writing word line; a source of the writing transistor and a source of the reading transistor are connected to the bit line; and the other electrode of the capacitor is connected to the reading word line.

In the writing transistor in an off state (in the case of an n-channel transistor, a state where the potential of the gate is lower than each of the potentials of the source and the drain), leakage current between the source and the drain is preferably $1 \times 10^{-20}$ A or lower, further preferably $1 \times 10^{-20}$ A or lower at a temperature when the transistor is used (e.g., 25° C.), or $1 \times 10^{-20}$ A or lower at 85° C.

In the case of a general silicon semiconductor, it is difficult to realize leakage current having such a small value; however, in a transistor obtained by processing an oxide semiconductor in a preferable condition, such a value can be achieved. Therefore, an oxide semiconductor is preferably used as a material of the writing transistor. Needless to say, if leakage current can be made to have a value smaller than or equal to the above-described value by another method with the use of a silicon semiconductor or other kinds of semiconductors, the use of such semiconductors is not precluded.

Although a variety of known materials can be used as an oxide semiconductor, the band gap of the material is preferably greater than or equal to 3 eV, further preferably greater than or equal to 3 eV and less than 3.6 eV. In addition, the electron affinity of the material is preferably greater than or equal to 4 eV, further preferably greater than or equal to 4 eV and less than 4.9 eV. An oxide containing gallium and indium is particularly suitable for an object of one embodiment of the present invention. Among such materials, a material whose carrier concentration derived from a donor or an acceptor is less than $1 \times 10^{-14}$ cm$^{-3}$, preferably less than $1 \times 10^{-11}$ cm$^{-3}$ is desirable.

As the reading transistor, although there is no particular limitation on the leakage current between a source and a drain in an off state, smaller leakage current is preferable because power consumption can be reduced. Further, a transistor which operates at high speed is desirable in order to increase the reading speed. Specifically, it is preferable to use a transistor with switching speed of 10 nanoseconds or less. Further, in both the writing transistor and the reading transistor, gate leakage current (leakage current between the gate and the source or between the gate and the drain) needs to be extremely small. Also in the capacitor, internal leakage current (leakage current between the electrodes) needs to be small. Each leakage current is preferably $1 \times 10^{-20}$ A or lower, further preferably $1 \times 10^{-21}$ A or lower at a temperature when the transistor or capacitor is used (e.g., 25° C.).

A potential of the gate of the reading transistor is changed in accordance with a potential of the reading word line. As a result, the gate capacitance of the reading transistor is changed. That is, the gate capacitance of the reading transistor in the case where the reading transistor is in an on state becomes larger than that in the case where the reading transistor is in an off state. When change in the gate capacitance is larger than the capacitance of the capacitor, a problem might be caused in operation of a memory cell.

Therefore, the capacitance of the capacitor is preferably larger than or equal to the gate capacitance of the reading transistor, further preferably larger than or equal to twice as large as the gate capacitance of the reading transistor. The capacitance of the capacitor is preferably 10 fF or smaller so that the semiconductor memory device operates at high speed.

The writing word line, the bit line, and the reading word line are arranged in matrix. It is desirable that the writing word line and the bit line be orthogonal to each other and the writing word line and the reading word line be parallel to each other so that matrix drive is performed.

An example of a memory cell having the above structure is illustrated in FIG. 1A. FIG. 1A illustrates a memory cell including a writing transistor WTr, a reading transistor RTr, and a capacitor C. Here, a drain of the writing transistor WTr is connected to a gate of the reading transistor RTr and one electrode of the capacitor C. In this example, a bias line S is illustrated in addition to a writing word line Q, a bit line R, and a reading word line P. The writing word line Q and the reading word line P are parallel to each other. The writing word line Q and the bit line R are orthogonal to each other.

That is, a gate of the writing transistor WTr is connected to the writing word line Q; a source of the writing transistor WTr and a source of the reading transistor RTr are connected to the bit line R; a drain of the reading transistor RTr is connected to the bias line S; and the other electrode of the capacitor C is connected to the reading word line P.

In the memory cell illustrated in FIG. 1A, the writing transistor WTr is turned on by applying appropriate potential to the writing word line Q. By the potential of the bit line R at this time, charge is injected to the drain of the writing transistor WTr. The amount of the charge injected at this time is determined in accordance with the potential of the bit line R, the gate capacitance of the reading transistor RTr, the capacitance of the capacitor C, and the like; thus, in the case where the conditions are the same, the result is always almost the same and a variation is small. In this manner, data is written.

Then, by applying different appropriate potential to the writing word line Q, the writing transistor WTr is turned off. In that case, the charge of the drain of the writing transistor WTr is held as it is. When the data is read, appropriate potential is applied to the reading word line P and a state of the reading transistor RTr is monitored, whereby data written can be known.

Another embodiment of the present invention is a semiconductor memory device including a memory unit. The memory unit includes a plurality of writing transistors, reading transistors, and capacitors which are the same or substantially the same as those described above. Here, the conductivity types of the writing transistor and the reading transistor are different from each other; for example, when the writing transistor has n-type conductivity, the reading transistor has p-type conductivity.

Here, a drain of a first writing transistor is connected to one electrode of a first capacitor and a gate of a first reading transistor, and a drain of a second writing transistor is connected to one electrode of a second capacitor and a gate of a second reading transistor.

Further, the drain of the first writing transistor is connected to a source of the second writing transistor, and a drain of the first reading transistor is connected to a source of the second reading transistor. Furthermore, a gate of the first writing transistor is connected to a first writing word line, a gate of the second writing transistor is connected to a second writing word line, the other electrode of the first capacitor is connected to a first reading word line, and the other electrode of the second capacitor is connected to a second reading word line.

A source of the first writing transistor and a source of the first reading transistor may be connected to a bit line. Note that one or more of transistors may be placed between the source of the first writing transistor and the bit line and/or between the source of the first reading transistor and the bit line.

The first writing word line, the second writing word line, the first reading word line, and the second reading word line are parallel to one another and orthogonal to the bit line.

An example of a memory unit having the above structure is illustrated in FIG. 2A. The memory unit illustrated here includes a plurality of unit memory cells each provided with one writing transistor, one reading transistor, and one capacitor. That is, illustrated is a memory unit including three memory cells, which are a first memory cell including a writing transistor WTr1, a reading transistor RTr1, and a capacitor C1, a second memory cell including a writing transistor WTr2, a reading transistor RTr2, and a capacitor C2, and a third memory cell including a writing transistor WTr3, a reading transistor RTr3, and a capacitor C3.

In each memory cell, a drain of the writing transistor is connected to one electrode of the capacitor and a gate of the reading transistor. Potentials of intersections at which these transistors and the capacitors are connected to one another relate to on and off of the reading transistors; therefore, hereinafter, these intersections are referred to as nodes F1, F2, and F3.

The drain of the writing transistor WTr1 is connected to a source of the writing transistor WTr2, and a drain of the reading transistor RTr1 is connected to a source of the reading transistor RTr2. Further, the drain of the writing transistor WTr2 is connected to a source of the writing transistor WTr3, and a drain of the reading transistor RTr2 is connected to a source of the reading transistor RTr3.

In this example, a drain of the reading transistor RTr3 is connected to the bias line S. One or more of transistors may be provided between the drain of the reading transistor RTr3 and the bias line S. Further, a source of the writing transistor WTr1 and a source of the reading transistor RTr1 are connected to the bit line R. Gates of the writing transistors WTr1, WTr2, and WTr3 are connected to writing word lines Q1, Q2, and Q3, respectively. The other electrodes of the capacitors C1, C2, and C3 are connected to reading word lines P1, P2, and P3, respectively.

The writing word lines Q1, Q2, and Q3 and the reading word lines P1, P2, and P3 are parallel to one another and orthogonal to the bit line R. In the case where the bias line S is kept at a constant potential, the bias line S is not necessarily parallel to or orthogonal to other wirings. Note that the bias line S is preferably orthogonal to the bit line for increasing the integration degree.

Thus, the three memory cells share one contact provided between the bit line and the memory cells, so that an area of the contact of the portion per unit memory cell can be reduced and the integration degree can be increased. An example in which three memory cells are provided in a memory unit is illustrated in FIG. 2A; however, one memory unit may include four or more memory cells. For example, one memory unit may include 16 memory cells, or 32 memory cells.

Such a structure is similar to the NAND structure of a flash memory. As illustrated in FIG. 2A, when memory cells are connected in series, a larger number of memory cells can share one contact provided between one bit line and the memory cells, whereby an area per unit memory cell can be reduced. For example, given that the minimum feature size is F, an area per unit memory cell in a semiconductor memory device can be reduced to $12 F^2$ or less.

The circuit diagram illustrated in FIG. 2A is one of memory units used in a semiconductor memory device. The semiconductor memory device is obtained by arranging these memory units in matrix. FIG. 5 illustrates an example of the structure. Here, illustrated are eight memory units of a memory unit in the n-th row and the (m−1-th column, a memory unit in the n-th row and the m-th column, a memory unit in the n-th row and the (m+1-th column, a memory unit in the n-th row and the (m+2-th column, a memory unit in the (n+1-th row and the (m−1 column, a memory unit in the (n+1-th row and the m-th column, a memory unit in the (n+1-th row and the (m+1-th column, and a memory unit in the (n+1-th row and the (m+2 column, in which 32 memory cells are included in total.

In the memory unit in the n-th row and the m-th column, writing word lines $Q1\_n$, $Q2\_n$, $Q3\_n$, and $Q4\_n$, reading word lines $P1\_n$, $P2\_n$, $P3\_22$, and $P4\_n$, a bias line $S\_n$, and a bit line $R\_m$ are provided. The other memory units are provided with similar wirings.

One embodiment of the present invention is a semiconductor memory device including a memory unit. The memory unit includes a plurality of writing transistors, reading transistors, and capacitors which are the same or substantially the same as those described above. Here, the conductivity types of the writing transistor and the reading transistor are different from each other; for example, when the writing transistor has n-type conductivity, the reading transistor has p-type conductivity.

Here, the drain of the first writing transistor is connected to one electrode of the first capacitor and a gate of the first reading transistor, a drain of the second writing transistor is connected to one electrode of the second capacitor and a gate of the second reading transistor, a drain of a third writing transistor is connected to one electrode of a third capacitor and a gate of a third reading transistor, and a drain of a fourth writing transistor is connected to one electrode of a fourth capacitor and a gate of a fourth reading transistor.

Further, the drain of the first writing transistor is connected to a source of the second writing transistor, and a drain of the first reading transistor is connected to a source of the second reading transistor. Similarly, the drain of the third writing transistor is connected to a source of the fourth writing transistor, and a drain of the third reading transistor is connected to a source of the fourth reading transistor.

Furthermore, a gate of the third writing transistor is connected to the first writing word line, the gate of the first writing transistor and the other electrode of the third capacitor are connected to the second writing word line, the other electrode of the first capacitor and a gate of the fourth writing transistor are connected to a third writing word line, and the gate of the second writing transistor and the other electrode of the fourth capacitor are connected to the fourth writing word line.

The source of the first writing transistor and the source of the first reading transistor may be connected to the bit line. Note that one or more of transistors may be placed between the source of the first writing transistor and the bit line and/or between the source of the first reading transistor and the bit line. Further, a gate of a transistor placed between the first writing transistor and the bit line may be connected to the first writing word line.

The first writing word line, the second writing word line, the third writing word line, and the fourth writing word line are parallel to one another and orthogonal to the bit line.

An example of a memory unit having the above structure is illustrated in FIG. 2B. The memory unit illustrated in FIG. 2B includes a plurality of unit memory cells each provided with one writing transistor, one reading transistor, and one capacitor. That is, illustrated is a memory unit including four memory cells, which are the first memory cell including the writing transistor WTr1, the reading transistor RTr1, and the capacitor C1, the second memory cell including the writing transistor WTr2, the reading transistor RTr2, and the capacitor C2, the third memory cell including the writing transistor WTr3, the reading transistor RTr3, and the capacitor C3, and a fourth memory cell including a writing transistor WTr4, a reading transistor RTr4, and a capacitor C4.

In each memory cell, a drain of the writing transistor, one electrode of the capacitor, and a gate of the reading transistor are connected to one another. Potentials of intersections at which these transistors and the capacitors are connected to one another relate to on and off of the reading transistors; therefore, hereinafter, these intersections are referred to as nodes F1, F2, F3, and F4.

The drain of the writing transistor WTr1 is connected to a source of the writing transistor WTr2, and a drain of the reading transistor RTr1 is connected to a source of the reading transistor RTr2. Further, the drain of the writing transistor WTr3 is connected to a source of the writing transistor WTr4, and a drain of the reading transistor RTr3 is connected to a source of the reading transistor RTr4.

In this example, the drain of the reading transistor RTr2 and a drain of the reading transistor RTr4 are connected to the bias line S. One or more of transistors may be provided between the drain of the reading transistor RTr2 and the bias line S, and/or between the drain of the reading transistor RTr4 and the bias line S.

The source of the writing transistor WTr1 is connected to a drain of a transistor Tr0. Although it is not necessary to provide the transistor Tr0 intentionally, it might be provided depending on the layout. However, when the potential of a gate of the transistor Tr0 is the same as that of a gate of the writing transistor WTr3, the transistor Tr0 does not adversely affect the operation.

The source of the transistor Tr0 and the source of the reading transistor RTr1 are connected to the bit line R. Gates of the writing transistors WTr1, WTr2, WTr3, and WTr4 are connected to writing word lines Q2, Q4, Q1, and Q3, respectively. The other electrodes of the capacitors C1, C3, and C4 are also connected to the writing word lines Q3, Q2, and Q4, respectively. The other electrode of the capacitor C2 is connected to the reading word line P.

Moreover, when the gate of the transistor Tr0 is connected to the writing word line Q1, the potential of the gate of the transistor Tr0 can be the same as that of the gate of the writing transistor WTr3, as described above.

The writing word lines Q1, Q2, Q3, and Q4 and the reading word line P are parallel to one another and orthogonal to the bit line R. In the case where the bias line S is kept at a constant potential, the bias line S is not necessarily parallel to or orthogonal to other wirings. Note that the bias line S is preferably orthogonal to the bit line for increasing the integration degree.

The four memory cells share one contact provided between the bit line and the memory cells, so that an area of the contact of the portion per unit memory cell can be reduced and the integration degree can be increased. A larger number of memory cells can share one contact provided between one bit line and the memory cells, whereby an area per unit memory cell can be reduced.

In addition, in this structure, an effect of reduction in area can be obtained by substituting part of the reading word line needed in the above structure with the writing word line. By such an effect, for example, an area per unit memory cell in a semiconductor memory device can be reduced to $8F^2$ or less.

According to one embodiment of the present invention, one memory cell includes a writing transistor, a reading transistor, and a capacitor which are the same or substantially the same as those described above. The conductivity type of the reading transistor is the same as that of the writing transistor. Further, as wirings connected to these, four kinds of wirings that are a writing word line, a bit line, a reading word line, and a selection line are prepared.

The drain of the writing transistor is connected to the gate of the reading transistor and one electrode of the capacitor. The drain of the reading transistor is connected to the source of the selection transistor. Further, the gate of the writing transistor is connected to the writing word line; the source of the writing transistor and the source of the reading transistor are connected to the bit line; and the other electrode of the capacitor is connected to the reading word line.

The writing word line, the bit line, the reading word line, and the selection line are arranged in matrix. It is desirable that the writing word line and the bit line be orthogonal to each other and the writing word line, the reading word line, and the selection line be parallel to one another so that matrix drive is performed.

An example of a memory cell having the above structure is illustrated in FIG. 12A. FIG. 12A illustrates a memory cell including the writing transistor WTr, the reading transistor RTr, a selection transistor STr, and the capacitor C. Here, the drain of the writing transistor WTr is connected to the gate of the reading transistor RTr and one electrode of the capacitor C. The drain of the reading transistor is connected to the source of the selection transistor.

In this example, the bias line S is illustrated in addition to the writing word line Q, the bit line R, the reading word line P, and a selection line T. The writing word line Q, the reading word line P, and the selection line T are parallel to one another. The writing word line Q and the bit line R are orthogonal to each other.

The gate of the writing transistor WTr is connected to the writing word line Q; the gate of the selection transistor STr is connected to the selection line T; the source of the writing transistor WTr and the source of the reading transistor RTr are connected to the bit line R; a drain of the selection transistor STr is connected to the bias line S; and the other electrode of the capacitor C is connected to the reading word line P.

In the memory cell illustrated in FIG. 12A, the writing transistor WTr is turned on by applying appropriate potential to the writing word line Q. By the potential of the bit line R at this time, charge is injected to the drain of the writing transistor WTr. The amount of the charge injected at this time is determined in accordance with the potential of the bit line R, the gate capacitance of the reading transistor RTr, the capacitance of the capacitor C, and the like; thus, in the case where the conditions are the same, the result is always almost the same and a variation is small. In this manner, data is written.

Then, by applying different appropriate potential to the writing word line Q, the writing transistor WTr is turned off. In that case, the charge of the drain of the writing transistor WTr is held as it is. When the data is read, appropriate potential is applied to the reading word line P and a state of the reading transistor RTr is monitored, whereby data written can be known.

One embodiment of the present invention is a semiconductor memory device including a memory unit. The memory unit includes a plurality of writing transistors, reading transistors, and capacitors which are the same or substantially the same as those described above. Here, the conductivity types of the writing transistor and the reading transistor are the same.

Here, the drain of the first writing transistor is connected to one electrode of the first capacitor and the gate of the first reading transistor, and the drain of the second writing transistor is connected to one electrode of the second capacitor and the gate of the second reading transistor.

Further, the drain of the first writing transistor is connected to the source of the second writing transistor, and the drain of the first reading transistor is connected to the source of the second reading transistor. Furthermore, the gate of the first writing transistor is connected to the first writing word line, the gate of the second writing transistor is connected to the second writing word line, the other electrode of the first capacitor is connected to the first reading word line, and the other electrode of the second capacitor is connected to the second reading word line.

The source of the first writing transistor and the source of the first reading transistor may be connected to the bit line. Note that one or more of transistors may be placed between the source of the first writing transistor and the bit line and/or between the source of the first reading transistor and the bit line.

The first writing word line, the second writing word line, the first reading word line, and the second reading word line are parallel to one another and orthogonal to the bit line.

An example of a memory unit having the above structure is illustrated in FIG. 13A. The memory unit illustrated here includes a plurality of unit memory cells each provided with one writing transistor, one reading transistor, and one capacitor. That is, illustrated is a memory unit including three memory cells, which are a first memory cell including a writing transistor WTr1, a reading transistor RTr1, and a capacitor C1, a second memory cell including a writing transistor WTr2, a reading transistor RTr2, and a capacitor C2, and a third memory cell including a writing transistor WTr3, a reading transistor RTr3, and a capacitor C3.

In each memory cell, a drain of the writing transistor is connected to one electrode of the capacitor and a gate of the reading transistor. Potentials of intersections at which these transistors and the capacitors are connected to one another relate to on and off of the reading transistors; therefore, hereinafter, these intersections are referred to as nodes F1, F2, and F3.

The drain of the writing transistor WTr1 is connected to a source of the writing transistor WTr2, and a drain of the reading transistor RTr1 is connected to a source of the reading transistor RTr2. Further, the drain of the writing transistor WTr2 is connected to a source of the writing transistor WTr3, and a drain of the reading transistor RTr2 is connected to a source of the reading transistor RTr3.

Further, a drain of the reading transistor RTr3 is connected to a source of a selection transistor STr1. In this example, a drain of the selection transistor STr1 is connected to the bias line S. Further, the source of the writing transistor WTr1 and the source of the reading transistor RTr1 are connected to the bit line R. The gates of the writing transistors WTr1, WTr2, and WTr3 are connected to the writing word lines Q1, Q2, and Q3, respectively. The other electrodes of the capacitors C1, C2, and C3 are connected to the reading word lines P1, P2, and P3, respectively.

The writing word lines Q1, Q2, and Q3 and the reading word lines P1, P2, and P3 are parallel to one another and orthogonal to the bit line R. Further, a gate of the selection transistor STr1 is connected to the selection line T, and the selection line T is parallel to the writing word lines Q1, Q2, and Q3 and the reading word line P1, P2, and P3. In the case where the bias line S is kept at a constant potential, the bias line S is not necessarily parallel to or orthogonal to other wirings. Note that the bias line S is preferably orthogonal to the bit line for increasing the integration degree.

Thus, the three memory cells share one contact provided between the bit line and the memory cells, so that an area of the contact of the portion per unit memory cell can be reduced and the integration degree can be increased. An example in which three memory cells are provided in a memory unit is illustrated in FIG. 13A; however, one memory unit may include four or more memory cells. For example, one memory unit may include 16 memory cells, or 32 memory cells.

As illustrated in FIG. 13A, when memory cells are connected in series, a larger number of memory cells can share one contact provided between one bit line and the memory cells, whereby an area per unit memory cell can be reduced. For example, given that the minimum feature size is F, an area per unit memory cell in a semiconductor memory device can be reduced to 12 $F^2$ or less.

The circuit diagram illustrated in FIG. 13A is one of memory units used in a semiconductor memory device. The semiconductor memory device is obtained by arranging these memory units in matrix. FIG. 16 illustrates an example of the structure. Here, illustrated are eight memory units of a memory unit in the n-th row and the (m−1-th column, a memory unit in the n-th row and the m-th column, a memory unit in the n-th row and the (m+1-th column, a memory unit in the n-th row and the (n+2-th column, a memory unit in the (n+1-th row and the (m−1 column, a memory unit in the (n+1-th row and the m-th column, a memory unit in the (n+1-th row and the (m+1-th column, and a memory unit in the (n+1-th row and the (m+2 column, in which 24 memory cells are included in total.

In the memory unit in the n-th row and the m-th column, the writing word lines Q1_n, Q2_n, and Q3_n, the reading word lines P1_n, P2_n, and P3_n, a selection line T_n, the bias line S_n, and the bit line R_m are provided. The other memory units are provided with similar wirings.

Note that a second selection transistor STr2 may be provided between the source of the reading transistor RTr1 and the bit line R, as illustrated in FIG. 13B. A gate of the selection transistor STr2 is connected to a selection line T'. In this case, it is preferable that a signal applied to the gate of the selection transistor STr2 be the same as or be synchronized with a signal applied to the gate of the selection transistor STr1. Accordingly, the selection line T and the selection line T' may be formed of the same wiring.

Alternatively, a structure in which the selection transistor is not provided may be employed as illustrated in FIG. 13C.

One embodiment of the present invention is a semiconductor memory device including a memory unit. The memory unit includes a plurality of writing transistors, reading transistors, and capacitors which are the same or substantially the same as those described above. Here, the conductivity types of the writing transistor and the reading transistor are the same.

That is, the drain of the first writing transistor is connected to one electrode of the first capacitor and the gate of the first reading transistor, the drain of the second writing transistor is connected to one electrode of the second capacitor and the gate of the second reading transistor, the drain of the third writing transistor is connected to one electrode of the third capacitor and the gate of the third reading transistor, and the drain of the fourth writing transistor is connected to one electrode of the fourth capacitor and the gate of the fourth reading transistor.

Further, the drain of the first writing transistor is connected to the source of the second writing transistor, and the drain of the first reading transistor is connected to the source of the second reading transistor. Similarly, the drain of the third writing transistor is connected to the source of the fourth writing transistor, and the drain of the third reading transistor is connected to the source of the fourth reading transistor.

Furthermore, the gate of the first writing transistor and the other electrode of the third capacitor are connected to the first writing word line, the other electrode of the first capacitor and the gate of the fourth writing transistor are connected to the second writing word line, the gate of the second writing transistor and the other electrode of the fourth capacitor are connected to the third writing word line, and the other electrode of the second capacitor is connected to the reading word line.

A drain of the second reading transistor may be connected to the source of the first selection transistor, and the drain of the fourth reading transistor may be connected to a source of the second selection transistor. A gate of the first selection transistor and a gate of the second selection transistor both may be connected to the same selection line.

Note that one or more of transistors may be placed between the source of the first writing transistor and the bit line and/or between the source of the first reading transistor and the bit line.

The first writing word line, the second writing word line, the third writing word line, the reading word line, and the selection line are parallel to one another and orthogonal to the bit line.

An example of a memory unit having the above structure is illustrated in FIGS. 17A and 17B. The memory unit illustrated in FIG. 17A includes a plurality of unit memory cells each provided with one writing transistor, one reading transistor, and one capacitor. That is, illustrated is a memory unit including three memory cells, which are the first memory cell including the writing transistor WTr1, the reading transistor RTr1, and the capacitor C1, the second memory cell including the writing transistor WTr2, the reading transistor RTr2, and the capacitor C2, the third memory cell including the writing transistor WTr3, the reading transistor RTr3, and the capacitor C3, and the fourth memory cell including the writing transistor WTr4, the reading transistor RTr4, and the capacitor C4.

In each memory cell, a drain of the writing transistor, one electrode of the capacitor, and a gate of the reading transistor are connected to one another. Potentials of intersections at which these transistors and the capacitors are connected to one another relate to on and off of the reading transistors; therefore, hereinafter, these intersections are referred to as nodes F1, F2, F3, and F4.

The drain of the writing transistor WTr1 is connected to the source of the writing transistor WTr2, and the drain of the reading transistor RTr1 is connected to the source of the reading transistor RTr2. Further, the drain of the writing transistor WTr3 is connected to the source of the writing transistor WTr4, and the drain of the reading transistor RTr3 is connected to the source of the reading transistor RTr4.

Further, the drain of the reading transistor RTr2 is connected to a source of the first selection transistor STr1, and the drain of the reading transistor RTr4 is connected to a source of the second selection transistor STr2. The gates of the selection transistors STr1 and STr2 both are connected to the selection line T. Furthermore, in this example, the drains of the selection transistors STr1 and STr2 is connected to the bias line S.

In example illustrated in FIG. 17A, the source of the writing transistor WTr1 is connected to the drain of the transistor Tr0. Although it is not necessary to provide the transistor Tr0 intentionally, it might be provided depending on the layout. However, when the potential of the gate of the transistor Tr0 is the same as that of the gate of the writing transistor WTr3, the transistor Tr0 does not adversely affect the operation.

The source of the transistor Tr0 and the source of the reading transistor RTr1 are connected to the bit line R. The gates of the writing transistors WTr1, WTr2, WTr3, and WTr4 are connected to the writing word lines Q2, Q4, Q1, and Q3, respectively. The other electrodes of the capacitors C1, C3, and C4 are also connected to the writing word lines Q3, Q2, and Q4, respectively. The other electrode of the capacitor C2 is connected to the reading word line P.

Moreover, when the gate of the transistor Tr0 is connected to the writing word line Q1, the potential of the gate of the transistor Tr0 can be the same as that of the gate of the writing transistor WTr3, as described above.

The writing word lines Q1, Q2, Q3, and Q4, the reading word line P, and the selection line T are parallel to one another and orthogonal to the bit line R. In the case where the bias line S is kept at a constant potential, the bias line S is not necessarily parallel to or orthogonal to other wirings. Note that the bias line S is preferably orthogonal to the bit line for increasing the integration degree.

Although two selection transistors are provided in one memory unit in FIG. 17A, one selection transistor may be provided. FIG. 17B is a circuit diagram in that case. In FIG. 17B, the drain of the second reading transistor and the drain of the fourth reading transistor are connected to a source of the selection transistor STr1, and the second selection transistor STr2 illustrated in FIG. 17A is omitted. In such a structure, layout of transistors has space and thus a contact hole or a connection electrode can be additionally provided.

The four memory cells share a selection transistor and one contact provided between the bit line and the memory cells, so that an area of the contact of the portion per unit memory cell can be reduced and the integration degree can be increased. A larger number of memory cells can share one contact provided between one bit line and the memory cells, whereby an area per unit memory cell can be reduced.

In addition, in this structure, an effect of reduction in area can be obtained by substituting part of the reading word line in the above structure with the writing word line. By such an effect, for example, an area per unit memory cell in a semiconductor memory device can be reduced to $8F^2$ or less.

By employing any of the above-described structures, at least one of the above-described objects can be achieved. In each of the above structures, since the writing operation is performed by ordinarily turning a transistor on or off, the problem of deterioration of an insulating film cannot occur. Thus, there is substantially no limit on the number of rewriting times in the semiconductor memory device.

One embodiment of the present invention also shows excellent characteristics related to a period during which data can be stored. Charge can be held for 10 hours or longer, further, 100 hours or longer by making leakage current between the source and the drain of the transistor in an off state, gate leakage current, and internal leakage current in the capacitor meet the above-described conditions. Moreover, by improving conditions, charge can be held for one month or longer, or one year or longer.

In the case where the charge is reduced due to the leakage current, refreshing may be performed in a manner similar to that of a conventional DRAM; an interval between refreshing operations is determined in accordance with a period during which the charge can be held. In the case where the charge is held for such a long period as described above, refreshing is necessary, for example, only once a month or once a year. Frequent refreshing which is needed in a conventional DRAM is not necessary and thus power consumption of a semiconductor memory device is reduced.

Note that in a conventional DRAM, operation of writing data is needed again every time when the data is read; on the other hand, in the semiconductor memory devices having the above structures, such operation is not needed because data is not lost by operation of reading the data. Such a feature could be realized only in an SRAM. In the semiconductor memory devices described above, the number of transistors used in one memory cell is five or less, typically two, which is smaller than that in the case of a conventional SRAM. Furthermore, when one of the transistors is formed using an oxide semiconductor in a thin film shape, the integration degree can be increased because the transistor can be stacked over a conventional silicon semiconductor.

As for the integration degree, according to one embodiment of the present invention, an absolute value of necessary capacitance of a memory cell can be reduced. In a DRAM, for example, capacitance of at least 30 fF is needed because operation is interfered unless the capacitance of a memory cell is almost the same as or larger than the wiring capacitance. However, capacitance is proportional to the area. In the case where the integration degree is increased, the area of one memory cell is decreased; thus, necessary capacitance cannot be secured. For this reason, a capacitor having a large capacitance needs to be formed in a DRAM by employing a special shape or a special material.

On the other hand, according to one embodiment of the present invention, the capacitance of the capacitor can be determined by a relative proportion to the gate capacitance of the reading transistor. That is, as the integration degree is increased, the gate capacitance of the reading transistor is decreased; therefore, the capacitance necessary in the capacitor is also decreased in the same proportion. Therefore, even when the integration degree is increased, a capacitor having basically the same structure can be used.

Further, in the semiconductor memory devices having the above-described structures, high voltage, which is needed for writing and erasing in an FGNVM, is not needed. Further, since at the time of writing, charge is injected to the floating gate in one direction in a non-equilibrium state in an FGNVM, a variation in the amount of charge is large. Data at a plurality of stages which depends on the amount of the charge held in the floating gate can be stored. However, when the variation in the amount of the charge is considered, data at around four stages (2 bits) is general. Higher voltage needs to be used in order that data of a larger number of bits is stored.

On the other hand, charge is reversibly injected to the capacitor in the structures described above, and thus a variation is small; for example, a variation in the threshold voltage of the reading transistor due to injection of charge can be 0.5 V or lower. Thus, data at more stages can be held in one memory cell within a narrower voltage range; consequently, voltage for writing or reading can be lower. For example, voltage used for writing or reading data of 4 bits (16 stages) can be 10 V or lower.

BRIEF DESCRIPTION OF DRAWINGS

In the accompanying drawings:

FIGS. 10A to 10D are diagrams illustrating an example of a manufacturing process of a semiconductor memory device according to one embodiment of the present invention;

BEST MODE FOR CARRYING OUT THE INVENTION

Figure 1A:
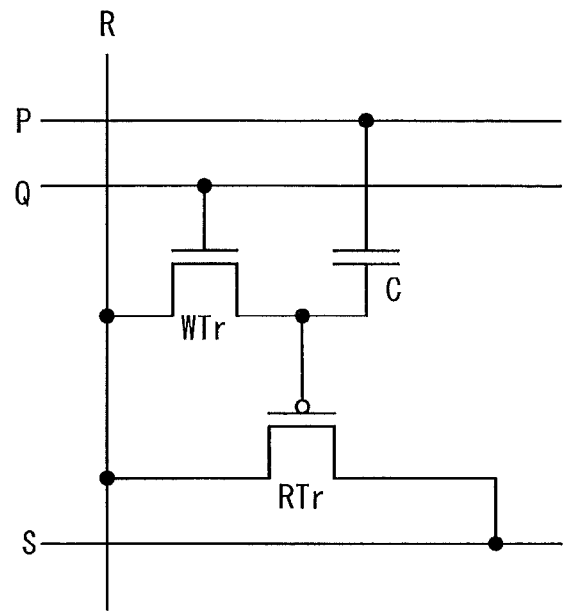
FIG. 1A is a diagram illustrating an example of a semiconductor memory device and FIGS. 1B to 1E are diagrams illustrating an example of a driving method of a semiconductor memory device according to one embodiment of the present invention.

Hereinafter, embodiments will be described with reference to drawings. Note that the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

The structures, the conditions, and the like disclosed in any of the following embodiments can be combined with those disclosed in other embodiments as appropriate. Note that in structures described below, the same portions or portions having similar functions are denoted by the same reference numerals in different drawings, and detailed description thereof is not repeated in some cases.

(Embodiment 1)

In this embodiment, an operation example of the semiconductor memory circuit illustrated in FIG. 1A will be described with reference to FIGS. 1B to 1E. Note that specific numeric values of potentials are given below for understanding the technical idea of the present invention. Needless to say, such values are changed depending on a variety of characteristics of a transistor and a capacitor, or the convenience of a practitioner. In the semiconductor memory circuit illustrated in FIG. 1A, data can be written and read by a method other than the method described below.

Here, the writing transistor WTr is an n-channel transistor and the reading transistor RTr is a p-channel transistor. The writing transistor WTr is turned on (current flows) when the potential of the gate is higher than any one of the potentials of the source and the drain by 1 V or more, and turned off under the other conditions (current does not flow). The reading transistor RTr is turned on (current flows) when the potential of the gate is lower than any one of the potentials of the source and the drain by 1 V or more, and turned off (current does not flow) under the other conditions.

The fluctuation in the gate capacitance of the reading transistor RTr, which is caused by the gate bias, is negligible as compared to the capacitance of the capacitor C. Further, the parasitic capacitance of the writing transistor WTr, the parasitic capacitance of the reading transistor RTr, the parasitic capacitance generated between wirings, and the like, which are not illustrated in the drawings, are considered to be 0. In FIGS. 1B to 1E, a circle is on a transistor in an on state, and a cross mark is on a transistor in an off state. A description may be written in the drawings when a transistor is turned on under a specific condition. In the following examples, the potential of the bias line S is always 0V.

Figure 1B:
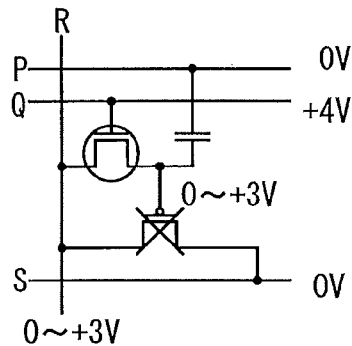

First, writing to a memory cell will be described. At the time of writing, as illustrated in FIG. 1B, a potential of the reading word line P is set to 0 V. A potential of the bit line R is set to a value at one of four levels of 0 V, +1 V, +2 V, and +3 V, in accordance with data to be written. When a potential of the writing word line Q is +4 V, the writing transistor WTr is turned on and a potential of the drain of the writing transistor WTr becomes close to a potential of the source of the writing transistor (i.e., the potential of the bit line R). Here, the potential of the drain of the writing transistor WTr becomes equal to the potential of the bit line R.

On the other hand, a potential of the gate of the reading transistor RTr is equal to the potential of the drain of the writing transistor WTr at this stage. That is, the potential of the gate of the reading transistor RTr is higher than or equal to 0 V and equal to a potential of the source of the reading transistor RTr (i.e., the potential of the bit line R).

A potential of the drain of the reading transistor RTr (i.e., the potential of the bias line S) is 0 V. Accordingly, the potential of the gate of the reading transistor RTr is higher than or equal to the potential of the source or the drain, so that the reading transistor RTr is in an off state. Thus, data can be written.

Note that keeping the reading transistor RTr in an off state as much as possible even at the time of writing is effective in reducing leakage current of the reading transistor RTr, which flows from the gate to the source or from the gate to the drain. In general, such leakage current increases when a transistor is in an on state and extremely decreases when a transistor is in an off state.

Because such leakage current is leak of charge held in the capacitor C, the more leakage current flows, the more a data holding time is decreased. In this embodiment, the reading transistor RTr is turned on only at the time of reading, which is excellent in storage of data.

Figure 1C:
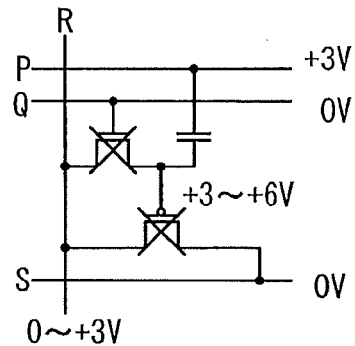

Next, in the case where writing is performed in a row other than the row, as illustrated in FIG. 1C, the potential of the writing word line Q is set to 0 V. In addition, the potential of the reading word line P is set to +3 V. The potential of the bit line R is set to a value at one of four levels of 0 V, +1 V, +2 V, and +3 V, in accordance with data to be written in the row where writing is performed.

Since the drain of the writing transistor WTr is connected to the reading word line P through the capacitor C, the potential of the drain of the writing transistor WTr is increased by 3 V in accordance with change in the potential of the reading word line P (i.e., increase in potential from 0 V, which is the state illustrated in FIG. 1B, to +3 V, which is the state illustrated in FIG. 1C). That is, the potential of the drain of the writing transistor WTr is set to +3 V, +4 V, +5 V, or +6 V, in accordance with the written data.

In this state, the potential (0 V) of the gate of the writing transistor WTr is lower than the potential (0 V to +3 V) of the source of the writing transistor WTr (the potential of the bit line R) and the potential (+3 V to +6 V) of the drain of the writing transistor WTr, so that the writing transistor WTr is turned off.

Further, the potential (+3 V to +6 V) of the gate of the reading transistor RTr is higher than the potential (0 V to +3 V) of the source of the reading transistor RTr (i.e., the potential of the bit line R) and the potential (0 V) of the drain of the reading transistor RTr (i.e., the potential of the bias line S), so that the reading transistor RTr is turned off.

Figure 1D:
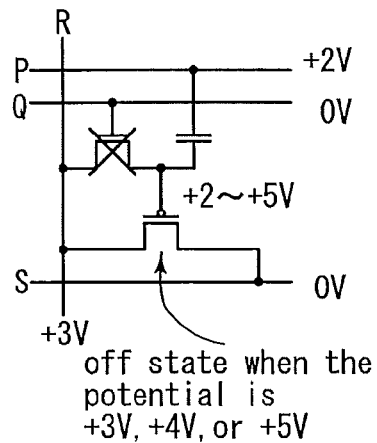

Next, the reading will be described. As illustrated in FIG. 1D, the potential of the writing word line Q is 0 V; the potential of the reading word line P is +2 V; and the potential of the bit line R is +3 V. In this state, the potential of the drain of the writing transistor WTr is set to +2 V, +3 V, +4 V, or +5 V in accordance with data written. The reading transistor RTr is turned on when the potential of the gate of the reading transistor RTr is +2 V, and turned off under the other conditions.

At this stage, in the case where the potential of the bit line R is 0 V when writing is performed, the potential of the gate of the reading transistor RTr is +2 V. That is, when the potential of the reading word line P is +2 V, the reading transistor RTr is turned on, which means that the potential of the bit line R is 0 V when writing is performed.

When the reading transistor RTr is turned on, current flows through the bit line R; thus, by detection of the current, it can be known that the reading transistor RTr is in an on state. Alternatively, when a capacitor is provided in an end portion of the bit line R, the initial potential (+3 V) becomes close to the potential (0 V) of the bias line S. Also in this case, it can also be known that the reading transistor RTr is in an on state.

Figure 1E:
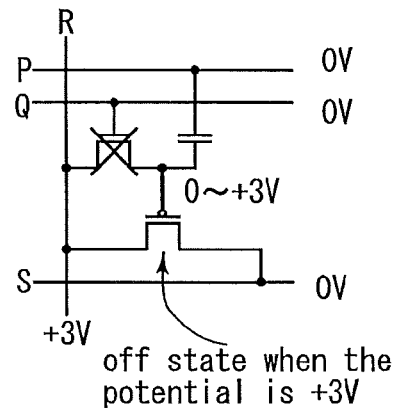

Similarly, when the potential of the reading word line P is 0 V as illustrated in FIG. 1E, the potential of the gate of the reading transistor RTr is 0 V, +1 V, +2V, or +3V. The reading transistor RTr is turned off only when the potential of the gate of the reading transistor RTr is +3 V, and turned on under the other conditions.

At this stage, in the case where the potential of the bit line R is +3 V when writing is performed, the potential of the gate of the reading transistor RTr is +3 V. That is, when the potential of the reading word line P is 0 V, the reading transistor RTr is turned off, which means that the potential of the bit line R is +3 V when writing is performed.

Note that data can be read by connecting a capacitor to the bit line R and measuring the potential of the bit line R. In FIG. 1E, for example, the potential of the gate of the reading transistor RTr is +2 V, the reading transistor RTr is turned on and the potential of the bit line R becomes close to that of the bias line S; when the potential of the bit line R is +2 V which is the same as the potential of the gate of the reading transistor RTr, the reading transistor RTr is turned off. Therefore, the potential of the bit line R is higher than or equal to +2 V and lower than +3 V.

Similarly, when the potential of the gate of the reading transistor RTr is +1 V, the potential of the bit line R is higher than or equal to +1 V and lower than +2 V; when the potential of the gate of the reading transistor RTr is 0 V, the potential of the bit line R is higher than or equal to 0 V and lower than +1 V. When the potential of the gate of the reading transistor RTr is +3 V, the reading transistor RTr is turned off and thus the potential of the bit line is kept at the initial value (+3 V).

In this manner, the data (2 bits) at four stages can be written and read. Needless to say, in a similar manner, much more data such as data (3 bits) at eight stages or data (4 bits) at 16 stages can be written and read.

In the above description, although the parasitic capacitance and the gate capacitance of the reading transistor RTr are negligible as compared to the capacitance of the capacitor C, voltage to be applied needs to be determined in view of such capacitance in an actual memory cell.

The gate capacitance of the reading transistor RTr in an on state and in an off state greatly varies; therefore, the potential of the gate of the reading transistor RTr is influenced by the variation. As the ratio of the gate capacitance of the reading transistor RTr to the capacitance of the capacitor C is higher, the influence is bigger. Accordingly, the capacitance of the capacitor C is preferably larger than or equal to twice as large as the gate capacitance of the reading transistor RTr.

Note that in order that data at some stages (multivalued data) be stored by making the amount of the charge held in the memory cell be at a plurality of stages, it is necessary that variation in the amount of the charge held is small. In the semiconductor memory circuit and the semiconductor memory device which are described in this embodiment, variation in the amount of the charge held is small, which is suitable for this purpose.

(Embodiment 2)

Figure 2A:
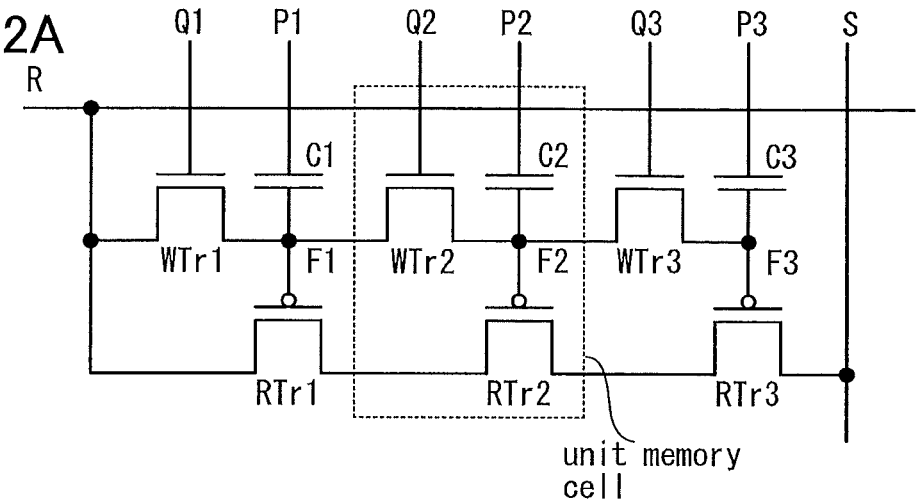
FIGS. 2A and 2B are diagrams illustrating an example of a semiconductor memory device according to one embodiment of the present invention.

In this embodiment, an operation example of the semiconductor memory circuit illustrated in FIG. 2A will be described with reference to FIGS. 3A to 3D and FIGS. 4A to 4E. Note that specific numeric values of potentials are given below for understanding the technical idea of the present invention. Needless to say, such values are changed depending on a variety of characteristics of a transistor and a capacitor, or the convenience of a practitioner. In the semiconductor memory circuit illustrated in FIG. 2A, data can be written and read by a method other than the method described below.

Here, the writing transistors WTr1, WTr2, and WTr3 are n-channel transistors and the reading transistors RTr1, RTr2, and RTr3 are p-channel transistors. The writing transistor is turned on when the potential of the gate is higher than any one of the potentials of the source and the drain by 1 V or more, and turned off under the other conditions. The reading transistor is turned on when the potential of the gate is lower than any one of the potentials of the source and the drain by 1 V or more, and turned off under the other conditions.

The fluctuation in the gate capacitance of each of the reading transistors RTr1, RTr2, and RTr3, which is caused by the gate bias, is negligible as compared to capacitance of each of the capacitors C1, C2, and C3. Further, the parasitic capacitance of the writing transistor WTr, the parasitic capacitance of the reading transistor RTr, the parasitic capacitance generated between wirings, and the like, which are not illustrated in the drawings, are considered to be 0. In FIGS. 3A to 3D and FIGS. 4A to 4E, a circle is on a transistor in an on state, and a cross mark is on a transistor in an off state. A description may be written in the drawings when a transistor is turned on under a specific condition. In the following examples, the potential of the bias line S is always 0V.

Figure 3A:
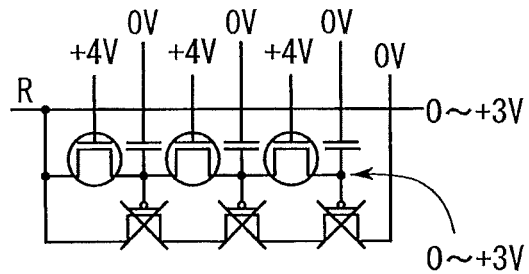
FIGS. 3A to 3D are diagrams illustrating an example of a driving method (writing) of a semiconductor memory device according to one embodiment of the present invention.

First, writing to a memory cell will be described. Writing is started from the rightmost memory cell. At the time of writing, as illustrated in FIG. 3A, potentials of the reading word lines P1, P2, and P3 are set to 0 V. A potential of the bit line R is set to a value at one of four levels of 0 V, +1 V, +2 V, and +3 V, in accordance with data to be written.

Then, potentials of writing word lines Q1, Q2, and Q3 are set to +4 V, whereby the writing transistors WTr1, WTr2, and WTr3 are turned on and a potential of a drain of the writing transistor WTr3 (i.e., a potential of a node F3) becomes close to the potential of the bit line R. Here, the potential of the drain of the writing transistor WTr3 becomes equal to the potential of the bit line R.

Figure 3B:
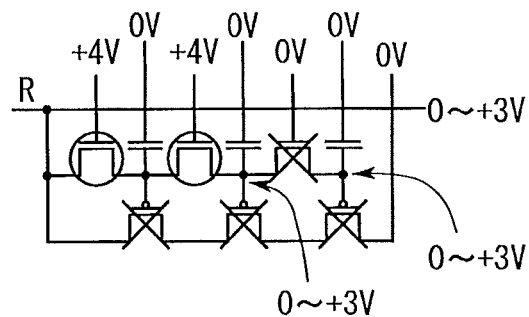
Figure 3C:
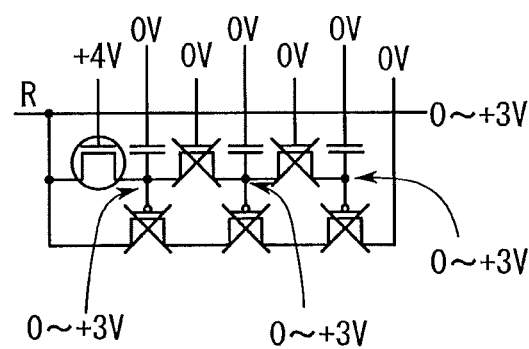

On the other hand, at this stage, the reading transistors RTr1, RTr2, and RTr3 are in an off state. Then, as illustrated in FIG. 3B, the potential of the writing word line Q3 is set to 0 V. Accordingly, the writing transistor WTr3 is turned off and the potential of the bit line R just before the writing transistor WTr3 is turned off is held in the node F3. In this manner, data can be written in the rightmost memory cell.

Next, data is written in the central memory cell. In a state illustrated in FIG. 3B, a potential of a node F2 is equal to the potential of the bit line R. Then, when the potential of the writing word line Q2 is set to 0 V (see FIG. 3C), the writing transistor WTr2 is turned off and the potential of the bit line R just before the writing transistor WTr2 is turned off is held in the node F2. In this manner, data can be written in the central memory cell.

Figure 3D:
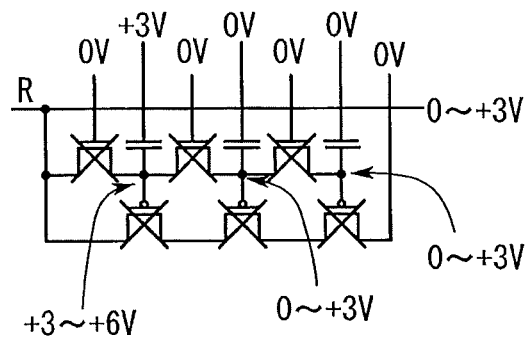

In such a manner, data can be written in all the memory cells. In the case where writing operation in the memory unit is not required, the potential of the reading word line P1 may be set to +3 V as illustrated in FIG. 3D. At this time, a potential of a node F1 is set to higher than or equal to +3 V and lower than or equal to +6 V. Since the potential of the bit line R is higher than or equal to 0 V and lower than or equal to +3 V, the reading transistor RTr1 can remain in an off state.

Figure 4A:
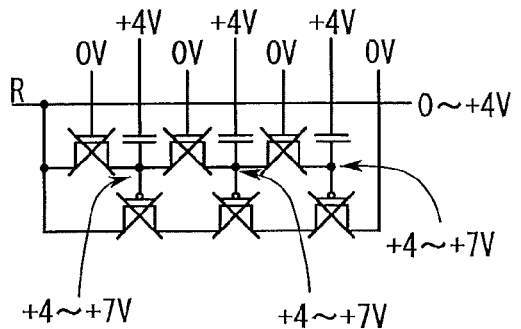
FIGS. 4A to 4E are diagrams illustrating an example of a driving method (reading) of a semiconductor memory device according to one embodiment of the present invention.

Next, reading will be described with reference to FIGS. 4A to 4E. First, in the case where reading is performed in a row other than the row including the memory unit, as illustrated in FIG. 4A, the potentials of the writing word lines Q1, Q2, and Q3 are set to 0 V, and the potentials of the reading word lines P1, P2, and P3 are set to +4 V. Accordingly, the writing transistors WTr1, WTr2, and WTr3 are turned off. Further, the potentials of the nodes F1, F2, and F3 are higher than or equal to +4 V and lower than or equal to +7 V. Since the potential of the bit line R is higher than or equal to 0 V and lower than or equal to +4 V as described later, the reading transistors RTr1, RTr2, and RTr3 can remain in an off state.

Figure 4B:
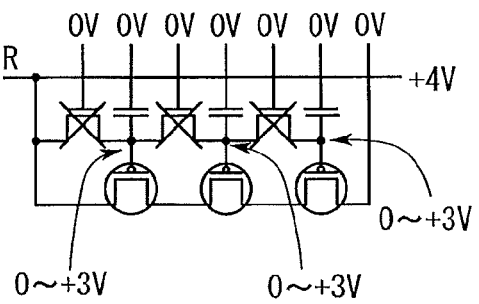

In the case where reading is performed in the memory unit, as illustrated in FIG. 4B, the potentials of the writing word lines Q1, Q2, and Q3 are set to 0 V, and the potentials of the reading word lines P1, P2, and P3 are set to 0 V. The potential of the bit line is set to +4 V. At this time, the writing transistors WTr1, WTr2, and WTr3 are in an off state. The potentials of the nodes F1, F2, and F3 are higher than or equal to 0 V and lower than or equal to +3 V, so that the reading transistors RTr1, RTr2, and RTr3 are turned on. Therefore, current flows between the bit line R and the bias line S.

In the case where a capacitor is provided in an end portion of the bit line R, the initial potential (+4 V) of the bit line R becomes close to the potential (0 V) of the bias line S when current flows between the bit line R and the bias line S. The potential of the bit line R is finally determined in accordance with the minimum values of the potentials of the nodes F1, F2, and F3. In any cases, the potential of the bit line R is changed within a range of higher than or equal to 0 V and lower than or equal to +4 V.

Figure 4C:
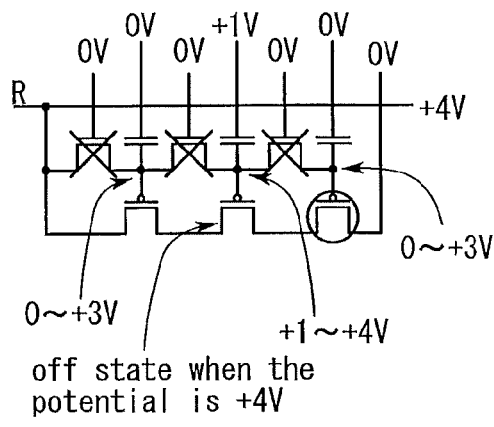

The data of the central memory cell in the memory unit is read below. As illustrated in FIG. 4C, when the potential of the reading word line P2 is increased to +1 V, the potential of the node F2 is set to +1 V, +2 V, +3 V, or +4 V in accordance with the written data. Here, when the potential of the node F2 is +4 V, the reading transistor RTr2 is turned off and current stops flowing between the bit line R and the bias line S.

At this stage, the potential of the node F2 is +4 V only in the case where the potential of the bit line is +3 V at the time of writing. That is, when the potential of the reading word line P2 is +1 V and the reading transistor RTr2 is in an off state, it is found that the potential of the bit line R is +3 V at the time of writing. Thus, a value of held data can be found.

Figure 4D:
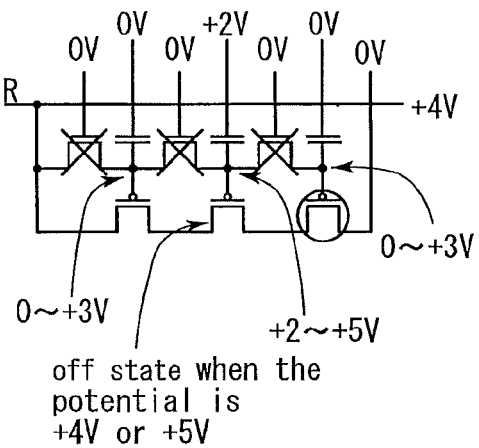

Further, as illustrated in FIG. 4D, when the potential of the reading word line P2 is increased to +2 V, the potential of the node F2 is set to +2 V, +3 V, +4 V, or +5 V in accordance with the written data. Here, when the potential of the node F2 is +4 V or +5 V, the reading transistor RTr2 is turned off and current stops flowing between the bit line R and the bias line S.

By detection of that, a value of the data can be known. That is, the potential of the gate of the reading transistor RTr2 is +4 V or +5 V at this stage only in the case where the potential of the bit line R is +2 V or +3 V at the time of writing. In the case where the reading transistor RTr2 is in an on state with the potential of the reading word line P2 of +1 V (i.e., the state illustrated in FIG. 4C) but is in an off state with the potential of the reading word line P2 of +2 V, the potential of the bit line R is +2 V at the time of writing.

Figure 4E:
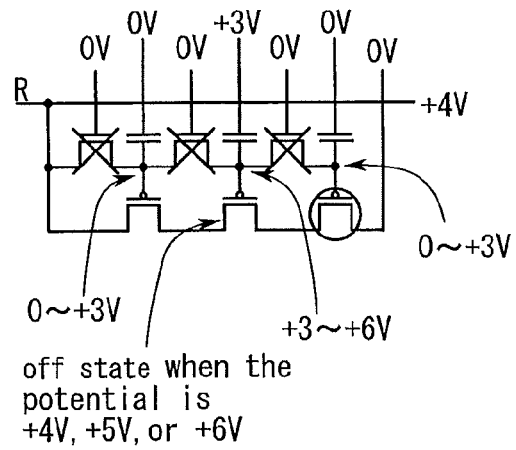
Figure 5:
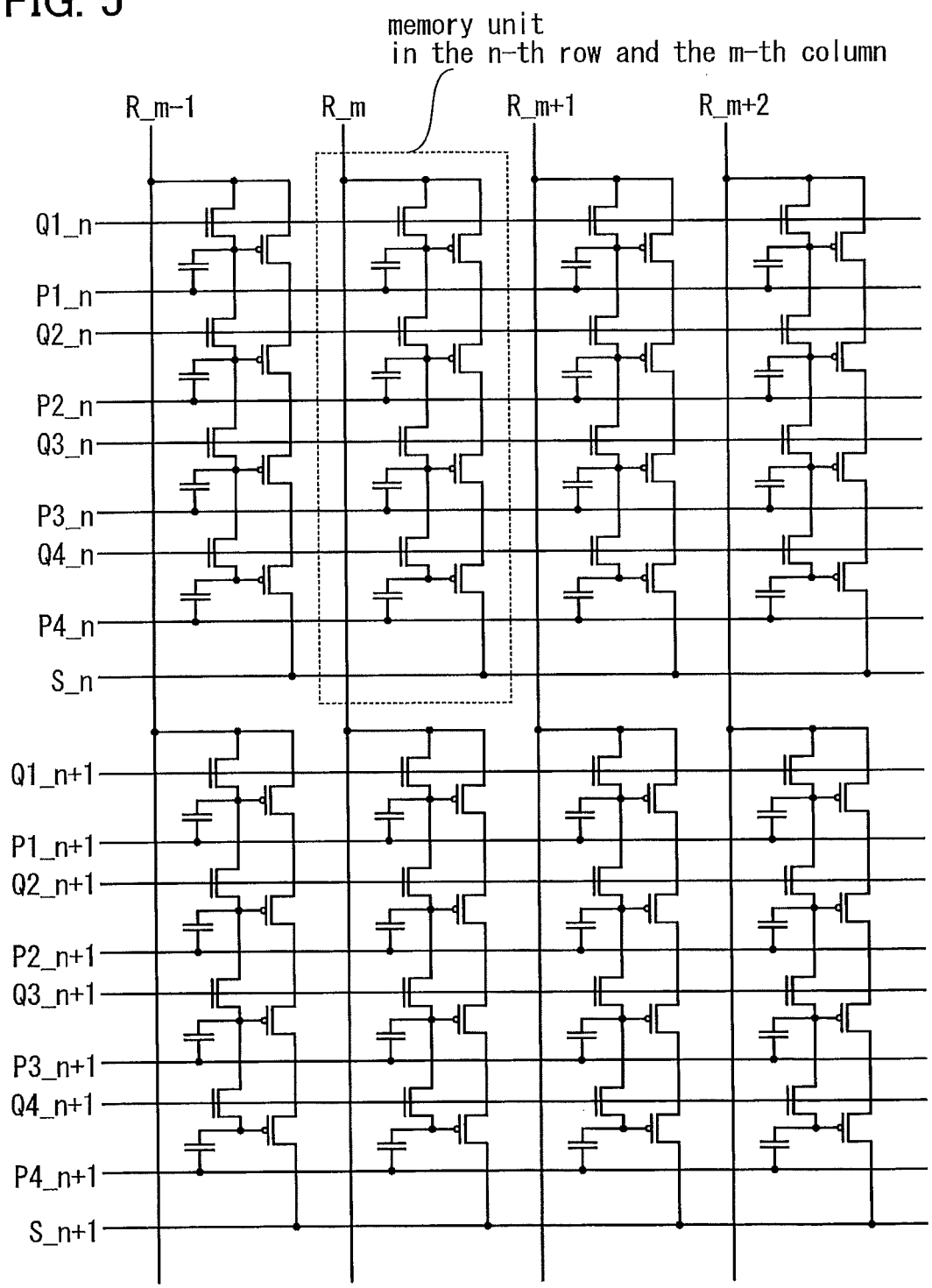
FIG. 5 is a diagram illustrating an example of a semiconductor memory device according to one embodiment of the present invention.

Similarly, as illustrated in FIG. 4E, when the potential of the reading word line P2 is increased to +3 V, the potential of the node F2 is set to +3 V, +4 V, +5 V, or +6 V in accordance with the written data. Here, when the potential of the node F2 is +4 V, +5 V, or +6 V, the reading transistor RTr2 is turned off and current stops flowing between the bias line R and the bias line S. That is, the potential of the bit line is +1 V, +2 V, or +3 V at the time of writing.

In the case where the potential of the bit line is 0 V at the time of writing, the potential of the node F2 is +3 V when the potential of the reading word line P2 is set to +3 V, and the reading transistor RTr2 is still in an on state. That is, in the case where current flows between the bit line R and the bias line S even when the potential of the reading word line P2 is +3 V, it is found that the potential of the bit line is 0 V at the time of writing.

The above described is the method for finding the value of the data by successively changing the potential of the reading word line P2; however, the value of the data can be found by measurement of a potential. For example, a capacitor is provided in an end portion of the bit line and a potential on the memory cell side is set to +4 V.

Further, the potentials of the writing word lines Q1, Q2, and Q3 and the potentials of the reading word lines P1 and P3 are set to −3 V. In this state, since the potentials of the nodes F1 and F3 are higher than or equal to −3 V and lower than or equal to 0 V, in the reading transistors RTr1 and RTr3, the potential of the bit line R can be equal to the potential (0 V) of the bias line S. To be exact, when the potential of the node F2 is lower than or equal to 0 V, the potential of the capacitor of the bit line R is higher than or equal to 0 V and lower than +1 V.

On the other hand, when the potential of the reading word line P2 is set to +3 V, the potential of the node F2 is higher than or equal to +3 V and lower than or equal to +6 V, so that the reading transistor RTr2 at this stage is in an off state. After that, when the potential of the reading word line P2 is decreased to 0 V, the potential of the node F2 is higher than or equal to 0 V and lower than or equal to +3 V, whereby the reading transistor RTr2 is turned on.

As described above, when the potential of the node F2 is 0 V, the potential of the capacitor of the bit line R is higher than or equal to 0 V and lower than +1 V. Here, the potential of the node F2 becomes 0 V in the case where the potential of the bit line is 0 V at the time of writing.

Similarly, when the potential of the node F2 is +1 V, the potential of the capacitor of the bit line R is higher than or equal to +1 V and lower than +2 V. When the potential of the node F2 is +2 V, the potential of the capacitor of the bit line R is higher than or equal to +2 V and lower than +3 V. When the potential of the node F2 is +3 V, the potential of the capacitor of the bit line R is higher than or equal to +3 V and lower than +4 V. In each case, the potential of the bit line at the time of writing can be detected. That is, the potential of the node F2 can be found by measurement of the potential of the capacitor of the bit line R, and further, the potential of the bit line at the time of writing can be found.

In this manner, the data (2 bits) at four stages can be written and read. Needless to say, much more data such as data (3 bits) at eight stages or data (4 bits) at 16 stages can be written and read in a similar manner.

In the above description, the parasitic capacitance and the gate capacitance of each of the reading transistors RTr1, RTr2, and RTr3 is negligible as compared to the capacitance of each of the capacitors C1, C2, and C3; however, voltage to be applied needs to be determined in view of such capacitance in an actual memory cell.

The gate capacitance of each of the reading transistors RTr1, RTr2, and RTr3 in an on state and in an off state greatly varies; therefore, the potentials of the gates of the reading transistors RTr1, RTr2, and RTr3 are influenced by the variation. As the ratio of the gate capacitance of each of the reading transistors RTr1, RTr2, and RTr3 to the capacitance of each of the capacitors C1, C2, and C3, respectively, is higher, the influence is bigger. Accordingly, the capacitance of each of the capacitors C1, C2, and C3 is preferably larger than or equal to twice as large as the gate capacitance of each of the reading transistors RTr1, RTr2, and RTr3.

(Embodiment 3)

In this embodiment, examples of a shape and a manufacturing method of the semiconductor memory device described in Embodiment 2 will be described. In this embodiment, an oxide semiconductor containing gallium and indium is used for a writing transistor and a single crystal silicon semiconductor is used for a reading transistor. Therefore, the writing transistor is stacked over the reading transistor.

That is, an insulated gate transistor including a single crystal silicon semiconductor which is provided over a single crystal silicon substrate is used as the reading transistor and a transistor including an oxide semiconductor is formed thereover as the writing transistor. Note that although an example in which a semiconductor memory device is formed over a single crystal silicon substrate is described in this embodiment, the semiconductor memory device can be provided over another kind of substrate.

Figure 8A:
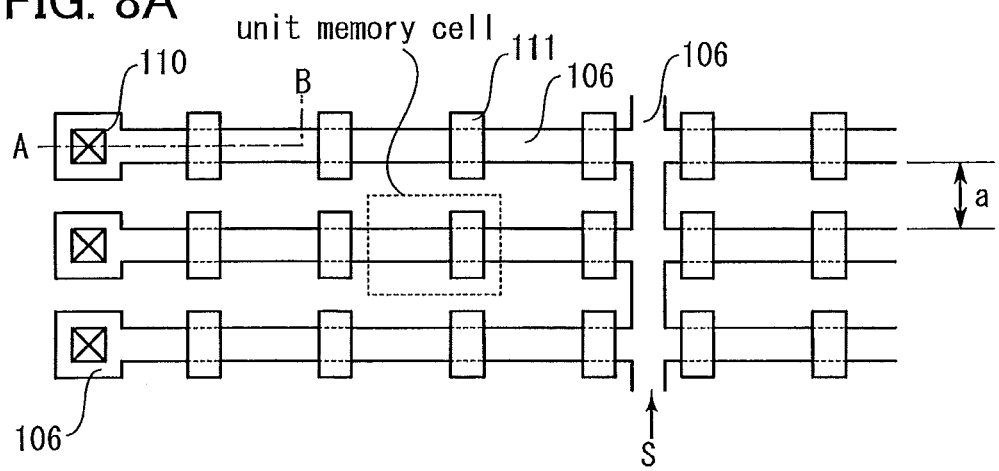
FIGS. 8A to 8C are diagrams illustrating an example of layout of wirings of a semiconductor memory device according to one embodiment of the present invention.
Figure 8B:
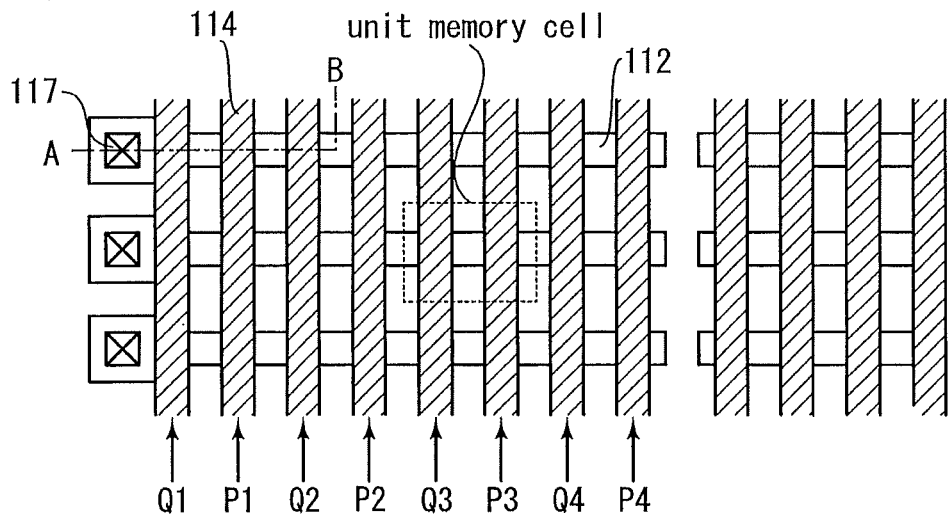
Figure 8C:
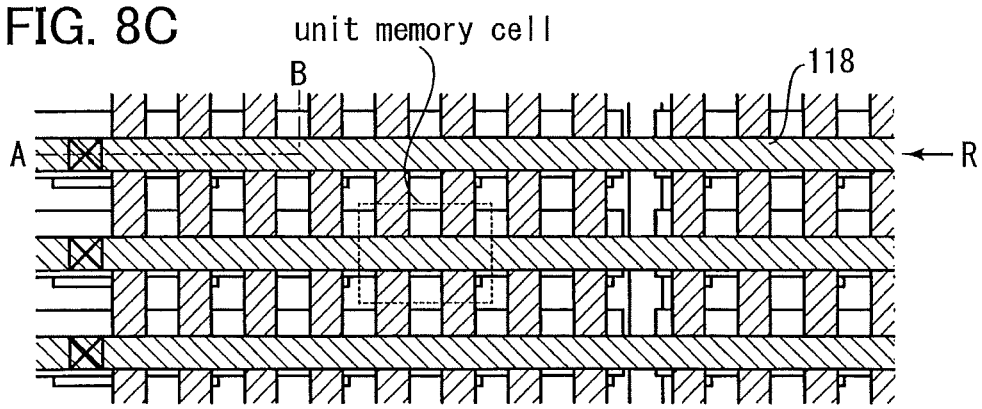

An example of layout of a memory unit of the semiconductor memory device in this embodiment is illustrated in FIGS. 8A to 8C. In this embodiment, a single memory unit includes four memory cells.

In FIG. 8A, main wirings, main electrodes, and the like provided over a single crystal silicon substrate are illustrated. An element separation region 102 is formed over the substrate. Over the substrate, a conductive region 106 is formed using a conductive material or doped silicon. Part of the conductive region 106 serves as a source and a drain of the reading transistor. Further, another part of the conductive region 106 serves as part of the bias line S. Some portions of the conductive region 106 are separated from each other by a gate electrode 111 of the reading transistor. A connection electrode 110 is provided in part of the conductive region 106.

When the bias line S is formed with the use of the conductive region 106, the integration degree can be increased. In that case, the bias line S needs to be provided so as to be parallel to a writing word line and a reading word line (that is, orthogonal to a bit line). Note that as illustrated, the integration degree can be increased in such a manner that a memory unit shares one bias line S with an adjacent memory unit.

A material which forms an ohmic contact with an oxide semiconductor to be formed later is preferable as a material of the gate electrode 111 and a material of the connection electrode 110. An example of such a material is a material whose work function W is almost the same as or smaller than electron affinity $\phi$ of the oxide semiconductor (an energy gap between the lowest end of the conduction band of the oxide semiconductor and the vacuum level). In other words, $W<\phi+0.3$ eV is satisfied. For example, titanium, molybdenum, and titanium nitride are be given.

Main wirings, main electrodes, and the like, focusing on the transistor including an oxide semiconductor, which is formed over the circuit illustrated in FIG. 8A, are illustrated in FIG. 8B. A plurality of island-shaped oxide semiconductor regions 112 and a plurality of wirings 114 are formed. The wirings 114 serve as the writing word lines Q1, Q2, Q3, and Q4 and the reading word lines P1, P2, P3, and P4.

Part of the wiring 114 overlaps with the oxide semiconductor and serves as a gate electrode of the writing transistor. The oxide semiconductor region 112 is in contact with the gate electrode 111 provided thereunder. Further, a capacitor is formed in a portion where part of the wiring 114 overlaps with the gate electrode 111. A connection electrode 117 for connecting to an upper layer (e.g., the bit line R) is provided in part of the oxide semiconductor region 112.

FIG. 8C illustrates a structure where the structure illustrated in FIG. 8A overlaps with the structure illustrated in FIG. 8B. In FIG. 8C, the structures are shifted a little from each other so as to see the overlap. Further, a wiring 118 formed over the transistor including an oxide semiconductor is also illustrated. The wiring 118 serves as the bit line R.

Note that a dot A and a dot B denote the same positions through FIGS. 8A to 8C.

In FIGS. 8A to 8C, the width of the conductive region 106 and the wiring 114 are processed to have the minimum feature size F. That is, the line width and the line interval are F. In that case, the size of the unit memory cell is 12 $F^2$. The memory unit includes a portion shared by the memory cells, so that the area per memory cell is actually greater than 12 $F^2$. The memory unit illustrated in FIGS. 8A to 8C are provided with four memory cells; as the number of memory cells in a memory unit is increased, the area per memory cell becomes close to 12 $F^2$.

Hereinafter, a method for manufacturing the semiconductor memory device having the above-described structure will be described. FIGS. 9A to 9D and FIGS. 10A to 10D are cross-sectional views taken along a line linking the dot A to the dot B in FIGS. 8A to 8C. In this embodiment, an n-type single crystal silicon substrate is used as a substrate; however, an n-type well may be formed in a p-type single crystal silicon substrate and the transistor of this embodiment may be formed thereover. A manufacturing process will be described below in numerical order of the cross-sectional views.

<FIG. 9A>

Figure 9A:
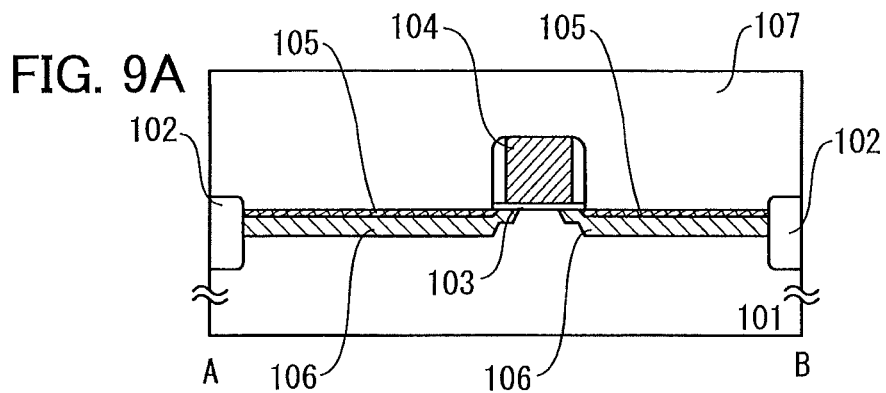
FIGS. 9A to 9D are diagrams illustrating an example of a manufacturing process of a semiconductor memory device according to one embodiment of the present invention.
Figure 9B:
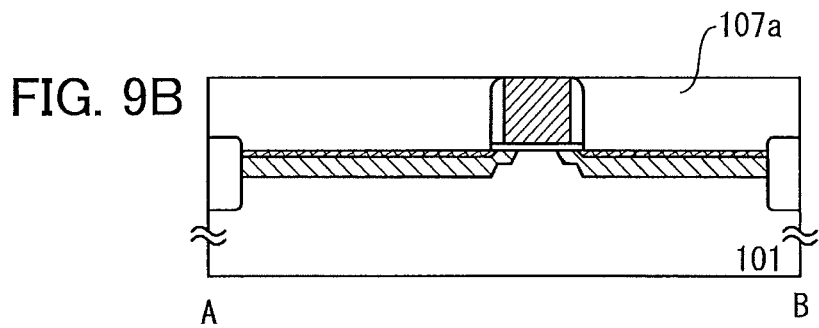
Figure 9C:
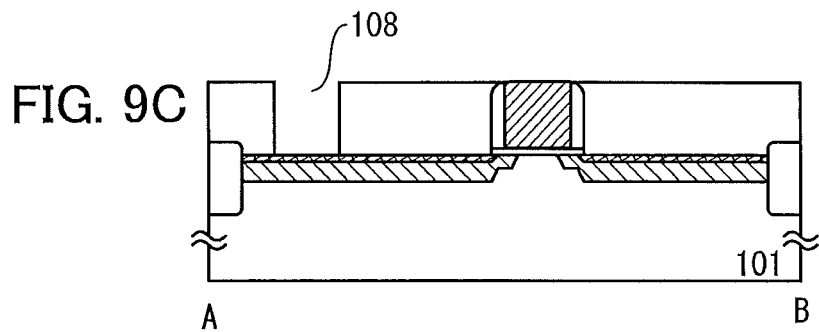
Figure 9D:
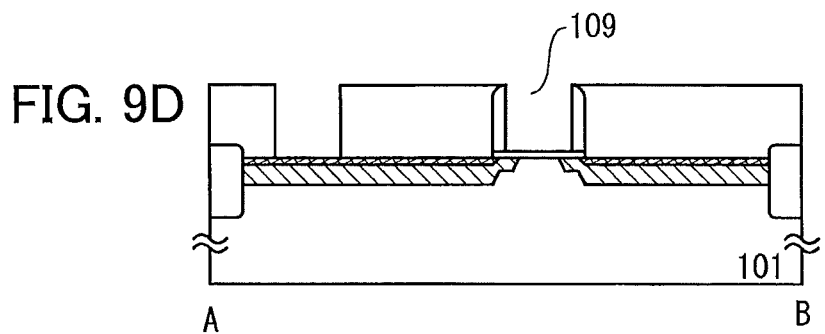

First, with the use of a known semiconductor manufacturing technique, as illustrated in FIG. 9A, the element separation region 102, the conductive region 106 formed using p-doped silicon, a gate insulating film 103, a dummy gate 104, and an interlayer insulator 107 are formed over an n-type single crystal silicon substrate 101. A sidewall may be provided on a side surface of the dummy gate 104 as illustrated in FIG. 9A.

Polycrystalline silicon may be used for the dummy gate 104. The thickness of the gate insulating film 103 is preferably 10 nm or more so that generation of leakage current is suppressed. In order that the gate capacitance is less than the capacitance of a capacitor to be formed later, a material having a low dielectric constant, such as silicon oxide, is preferably used for a dielectric of the gate insulating film 103.

Silicide region 105 may be formed over a surface of the conductive region 106 so as to increase conductivity. Further, since the conductive region 106 serves as part of the bias line S as described with reference to FIG. 8A, it is preferable that the conductive region 106 have high conductivity.

The interlayer insulator 107 may be formed as a single layer or a multilayer and may include a stress liner for causing a distortion in the channel of the transistor. Planarizing a film in the uppermost layer by a spin coating method facilitates a later step. For example, as the interlayer insulator 107, a multilayer film formed in such a manner that a silicon nitride film is formed by a plasma CVD method and a planarized silicon oxide film is formed by a spin coating method thereover may be used.

<FIG. 9B>

In the case where the surface of the interlayer insulator 107 is sufficiently planarized, the interlayer insulator 107 is etched by a dry etching method; the dry etching is stopped upon exposure of an upper surface of the dummy gate 104. A chemical mechanical polishing (CMP) method may be used instead of a dry etching method. The surface of the interlayer insulator 107 may be planarized by a CMP method first, and then etching may be further conducted by a dry etching method. Alternatively, after the interlayer insulator is etched to some extent by a dry etching method, planarizing treatment by a CMP method may be performed. Thus, the interlayer insulator 107 is processed into an interlayer insulator 107a having a planarized surface and the surface of the dummy gate 104 is exposed.

<FIG. 9C>

Next, the interlayer insulator 107a is selectively etched so that an opening 108 which reaches the silicide region 105 is formed.

<FIG. 9D>

Next, the dummy gate 104 is selectively etched and an opening 109 is formed. In the case where polycrystalline silicon is used as a material of the dummy gate 104, 2% to 40% TMAH (tetramethyl ammonium hydroxide), preferably 20% to 25% TMAH may be used for the etching.

Note that the formation order of the openings 108 and 109 may be reversed. It is preferable to form the opening 108 and then form the opening 109 as described above because the gate insulating film 103 is not in contact with a resist or the like. In that case, in order to prevent the single crystal silicon substrate 101 from being erosived by TMAH, the silicide region 105 is preferably formed over a surface of the conductive region 106.

<FIG. 10A>

A single-layer or a multilayer film of a conductive material is deposited. A material which forms an ohmic contact with an oxide semiconductor to be formed later is preferable as a conductive material. Further, this conductive film also serves as a gate electrode of the reading transistor (here, a p-channel transistor); therefore, a conductive material which has an appropriate physical property value, such as a work function, is preferable for decision of the threshold voltage of the transistor. When these two conditions are not satisfied by one material, a plurality of films is formed so that each condition is satisfied. For example, a multilayer film including titanium nitride and tantalum nitride film as a conductive material may be used.

Next, the film of the conductive material is etched by a CMP method to be planarized. This step may be stopped upon exposure of the interlayer insulator 107a or may be stopped after a while. Thus, as illustrated in FIG. 10A, the gate electrode 111 of the reading transistor and the connection electrode 110 are formed. After that, surface treatment by plasma including fluorine may be performed in order that hydrogen included in the vicinity of the surface of the interlayer insulator 107a is reduced. The treatment is not necessarily performed when the hydrogen concentration of the interlayer insulator 107a is sufficiently low. The hydrogen concentration in a region 100 nm deep from the surface of the interlayer insulator 107a is lower than $1\times10^{18}$ cm$^{-3}$, preferably lower than $1\times10^{16}$ cm$^{-3}$.

<FIG. 10B>

Then, an oxide semiconductor film having a thickness of 3 nm to 20 nm is formed by a sputtering method. A method other than a sputtering method may be employed as a method for forming the oxide semiconductor film. The oxide semiconductor preferably contains gallium and indium. The hydrogen concentration in the oxide semiconductor film may be lower than $1\times10^{18}$ cm$^{-3}$, preferably lower than $1\times10^{16}$ cm$^{-3}$ in order that the reliability of the semiconductor memory device be increased. The composition ratio of gallium to indium is higher than or equal to 0.5 and lower than 2, preferably higher than or equal to 0.9 and lower than 1.2. In addition to gallium and indium, the oxide semiconductor may contain zinc.

The island-shaped oxide semiconductor region 112 is formed by etching the oxide semiconductor film. The oxide semiconductor region 112 may be subjected to heat treatment so that semiconductor characteristics are improved. Thus, a structure in which the gate electrode 111 and the oxide semiconductor region 112 are in contact with each other and the connection electrode 110 and the oxide semiconductor region 112 are in contact with each other can be obtained.

Then, a gate insulating film 113 is formed by a known deposition method such as a sputtering method. In order that generation of leakage current is reduced, the thickness of the gate insulating film 113 is preferably 10 nm or more and the hydrogen concentration in the gate insulating film is preferably lower than $1\times10^{-18}$ cm$^{-3}$, further preferably lower than $1\times10^{-16}$ cm$^{-3}$.

Silicon oxide, aluminum oxide, hafnium oxide, lanthanum oxide, aluminum nitride, or the like may be used for the gate insulating film. A multilayer film of these materials may be used as well as a single-layer film thereof. The gate insulating film 113 is a dielectric of a capacitor which is formed later and is preferably formed using a material having a relative permittivity of 10 or more so that the capacitance of the capacitor is larger than the gate capacitance of the reading transistor. The oxide semiconductor region 112 may also be subjected to heat treatment after the gate insulating film is formed so that characteristics of the oxide semiconductor region 112 are improved.

<FIG. 10C>

A plurality of wirings 114 is formed using a conductive material. The wirings 114 serve as the writing word line Q1, the writing word line Q2, and the reading word line P1. Part of the writing word line Q1 or the writing word line Q2 serves as the gate electrode of the transistor including an oxide semiconductor. As a material of the wiring 114, a material having a work function which is larger than the electron affinity of the oxide semiconductor by 0.5 eV or more is preferable. Tungsten, gold, platinum, and p-type silicon are given as examples.

A capacitor with the gate insulating film 113 as a dielectric is formed between the gate electrode 111 and the reading word line P1. The capacitance of the capacitor is determined by the magnitude of overlapped part of the gate electrode 111 with the reading word line P1. The area of the overlapped part is preferably larger than or equal to 100 nm$^2$ and smaller than or equal to 0.01 μm$^2$.

Next, an ion of an element which is oxidized more easily than an oxide semiconductor is implanted by a known ion implantation method. Examples of such an element are titanium, zinc, magnesium, silicon, phosphorus, boron, and the like. In general, boron and phosphorus are used in a conventional semiconductor process and thus easy to use; particularly, as an ion to be implanted to the above-described thin gate insulating film 113 or the oxide semiconductor region 112, an ion of phosphorus whose atomic weight is greater than the atomic weight of boron is preferable.

It is desirable that hydrogen is mixed as little as possible in these ions. The hydrogen concentration in the ions is preferably 0.1% or lower. It is known that hydrogen serves as a donor of an oxide semiconductor. When hydrogen is mixed in the ions, hydrogen unfavorably implanted to the oxide semiconductor moves in the oxide semiconductor and the reliability of a semiconductor device is decreased.

In the oxide semiconductor, the implanted ions are combined with oxygen and the oxygen deficiency is generated; thus, the oxide semiconductor exhibits n-type conductivity. An oxide semiconductor is different from a silicon semiconductor in that many oxide semiconductors can obtain high conductivity without high-temperature heat treatment which is needed in the case of a silicon semiconductor for recovery of crystallinity after ion implantation.

In this manner, regions 115 exhibiting n-type conductivity are formed in the oxide semiconductor region 112. It is preferable that conditions of implantation of ions be set so that carrier (electron) concentration in these regions is $1 \times 10^{19}$ cm$^{-3}$ or higher, preferably $1 \times 10^{-20}$ cm$^{-3}$ or higher. The regions 115 exhibiting n-type conductivity are formed in a self-aligned manner using the wiring 114 as a mask. Since high-temperature heat treatment is not needed, a donor hardly diffuses again and the area where the regions 115 exhibiting n-type conductivity and the wiring 114 overlap with each other is extremely small.

Note that even when an oxide semiconductor has an extremely low concentration of a donor or an acceptor and is nearly intrinsic, in a portion of the oxide semiconductor which is in contact with a metal material to form an ohmic contact, an electron is injected from the metal material; thus, a portion within a radius of several tens nanometers from the metal material exhibits favorable conductivity. Accordingly, although the oxide semiconductor region over the gate electrode 111 illustrated in FIG. 10B is not subjected to doping, the oxide semiconductor region can be regarded as a conductive region.

<FIG. 10D>

After that, an interlayer insulator 116 of a single-layer thin film or a multilayer thin film is formed. A surface of the interlayer insulator 116 is planarized and selectively etched so as to form a contact hole reaching the region 115 exhibiting n-type conductivity, and the connection electrode 117 is embedded therein. Then, the wiring 118 is formed. The wiring 118 is a bit line. A similar wiring may be provided so as to be parallel to the wiring 114 or the bias line S. Thus, as illustrated in FIG. 10D, a memory cell of a semiconductor memory device, which includes a writing transistor 119, a reading transistor 120, and a capacitor 121, and a memory unit including such memory cells are manufactured.

(Embodiment 4)

Figure 2B:
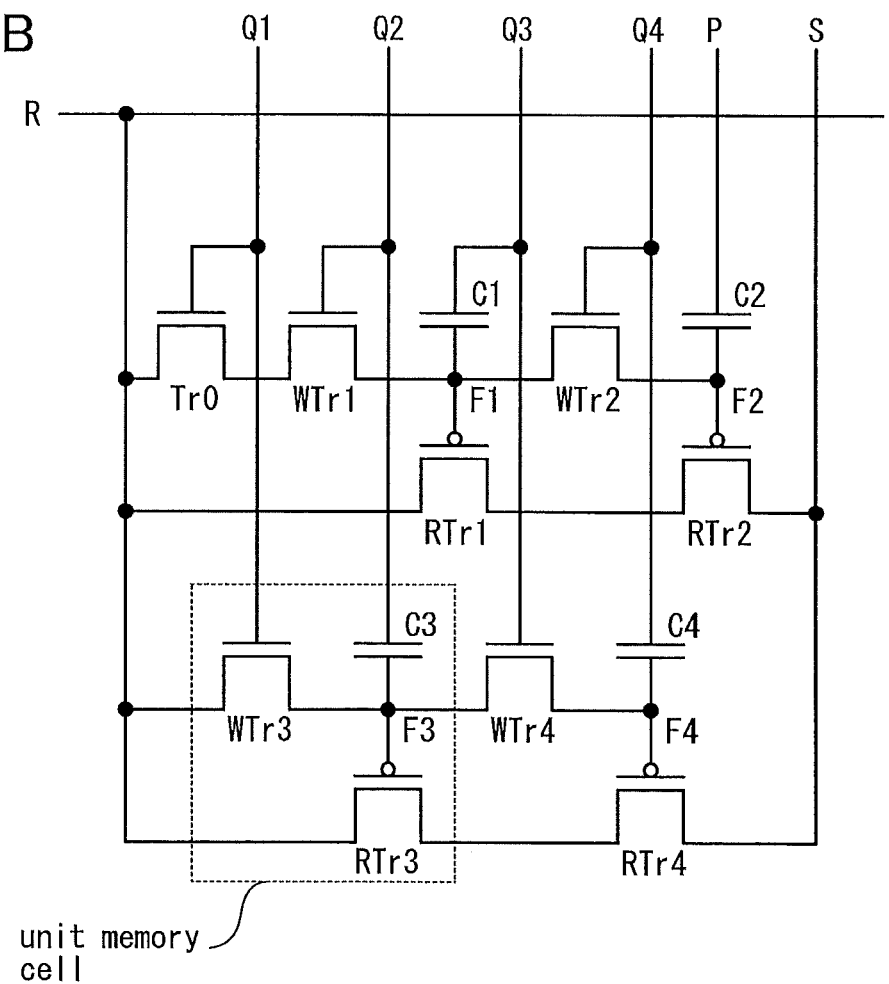

In this embodiment, an operation example of the semiconductor memory circuit illustrated in FIG. 2B will be described with reference to FIGS. 6A to 6D and FIGS. 7A to 7E. Note that specific values are given below as potentials for understanding the technical idea of the present invention. Needless to say, such values are changed depending on a variety of characteristics of a transistor, a capacitor, or the like, or for convenience of a practitioner. In the semiconductor memory circuit illustrated in FIG. 2B, data can written and read by a method other than the method described below.

Here, the transistor Tr0, the writing transistors WTr1, WTr2, WTr3, and WTr4 are n-channel transistors and the reading transistor RTr1, RTr2, RTr3, and RTr4 are p-channel transistors. The n-channel transistor is turned on when a potential of the gate is higher than a potential of either the source or the drain by 1 V or more, and the writing transistor is in an off state under the other conditions. The p-channel transistor is turned on when a potential of the gate is lower than a potential of either the source or the drain by 1 V or more, and the reading transistor is in an off state under the other conditions.

The fluctuation in the gate capacitance of each of the reading transistors RTr1, RTr2, RTr3, and RTr4, which is caused by the gate bias, is negligible as compared to the capacitance of each of the capacitors C1, C2, C3, and C4. Further, the parasitic capacitance of the writing transistors WTr1, WTr2, WTr3, and WTr4, the parasitic capacitance of the reading transistors RTr1, RTr2, RTr3, and RTr4, the parasitic capacitance generated between wirings, and the like, which are not illustrated in the drawings, are considered to be 0. In FIGS. 6A to 6D and FIGS. 7A to 7E, a circle is on a transistor in an on state, and a cross mark is on a transistor in an off state. A description is written when a transistor is turned on under a specific condition. In the example described below, the potential of the bias line S is always 0 V.

Figure 6A:
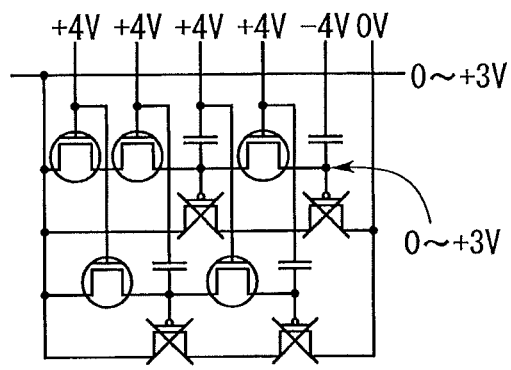
FIGS. 6A to 6D are diagrams illustrating an example of a driving method (writing) of a semiconductor memory device according to one embodiment of the present invention.

Writing is started from the rightmost memory cell. At the time of writing, as illustrated in FIG. 6A, potentials of writing word lines Q1, Q2, Q3, and Q4 are set to +4 V, and a potential of a reading word line P is set to −4 V. A potential of the bit line R is set to a value at one of four levels of 0 V, +1 V, +2 V, and +3 V in accordance with data to be written.

In this state, the transistor Tr0, the writing transistors WTr1, WTr2, WTr3, and WTr4 are turned on and the potential of the node F2 becomes close to the potential of the bit line R. Here, the potential of the node F2 becomes equal to the potential of the bit line R.

Figure 6B:
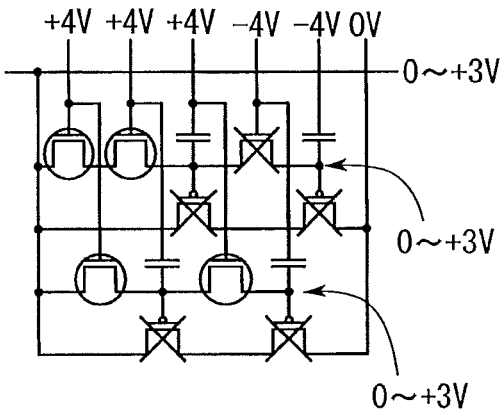
Figure 6C:
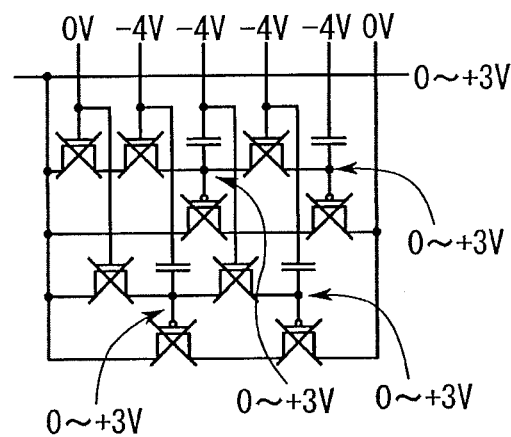

On the other hand, at this stage, the reading transistors RTr1, RTr2, RTr3, and RTr4 are in an off state. Then, as illustrated in FIG. 6B, the potential of the writing word line Q4 is set to −4 V. Accordingly, the writing transistor WTr2 is turned off and the potential of the bit line R just before the writing transistor WTr2 is turned off is held in the node F2. In this manner, data can be written in the rightmost memory cell.

Next, data is written in the second memory cell from the right (the node F4). In a state illustrated in FIG. 6B, a potential of the node F4 becomes equal to the potential of the bit line R. Then, when the potential of the writing word line Q3 is set to −4 V (see FIG. 6C), the writing transistor WTr4 is turned off and the potential of the bit line R just before the writing transistor WTr4 is turned off is held in the node F4. In this manner, data can be written in the second memory cell from the right. In this manner, data is sequentially written in other memory cells and thus data can be written in all the memory cells.

Figure 6D:
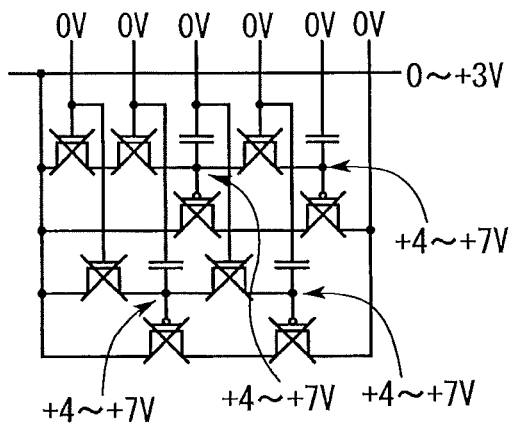

In the case where writing operation in the memory unit is not required, as illustrated in FIG. 6D, the potentials of the writing word lines Q1, Q2, Q3, and Q4 may be set to 0 V and the potential of the reading word line P may be set to 0 V. At this time, the potentials of the nodes F1, F2, F3, and F4 become higher than or equal to +4 V and lower than or equal to +7 V. Since the potential of the bit line R is higher than or equal to 0 V and lower than or equal to +3 V, the reading transistors RTr1, RTr2, RTr3, and RTr4 can remain in an off state.

Figure 7A:
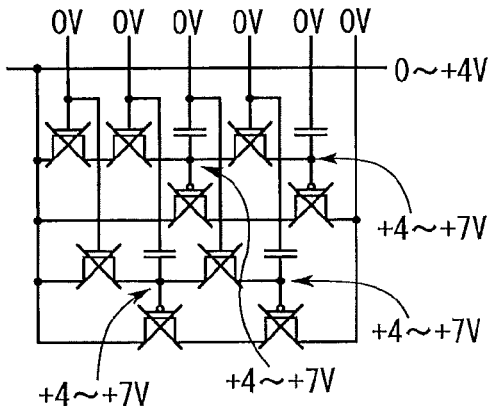
FIGS. 7A to 7E are diagrams illustrating an example of a driving method (reading) of a semiconductor memory device according to one embodiment of the present invention.

Next, reading will be described with reference to FIGS. 7A to 7E. First, in the case where reading is performed in a row other than the row including the memory unit, as illustrated in FIG. 7A, the potentials of the writing word lines Q1, Q2, Q3, and Q4 are set to 0 V, and the potential of the reading word line P is set to 0 V. Accordingly, the transistor Tr0, the writing transistors WTr1, WTr2, WTr3, and WTr4 are turned off. Further, the potentials of the nodes F1, F2, F3, and F4 are higher than or equal to +4 V and lower than or equal to +7 V. Since the potential of the bit line R is higher than or equal to 0 V and lower than or equal to +4 V as described later, the reading transistors RTr1, RTr2, RTr3, and RTr4 can remain in an off state.

Figure 7B:
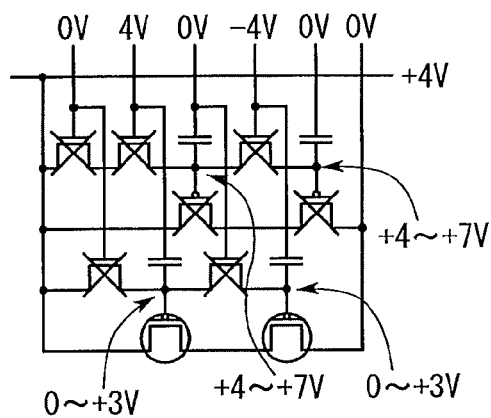

In the case where reading is performed in the memory unit, as illustrated in FIG. 7B, the potentials of the writing word lines Q2 and Q4 are set to −4 V, the potentials of the writing word lines Q1 and Q3 are set to 0 V, and the potential of the reading word line P is set to 0V. The potential of the bit line is set to +4 V. At this time, the transistor Tr0, the writing transistors WTr1, WTr2, WTr3, and WTr4 are in an off state. The potentials of the nodes F1 and F2 are higher than or equal to +4 V and lower than or equal to +7 V, so that the reading transistors RTr1 and RTr2 are turned off. On the other hand, the potentials of the nodes F3 and F4 are higher than or equal to 0 V and lower than or equal to +3 V, so that the reading transistors RTr3 and RTr4 are turned on. Therefore, current flows between the bit line R and the bias line S.

In the case where a capacitor is provided in an end portion of the bit line R, the initial potential (+4 V) of the bit line R becomes close to the potential (0 V) of the bias line S when current flows between the bit line R and the bias line S. The potential of the bit line R is finally determined in accordance with the minimum values of the potentials of the nodes F3 and F4. In any cases, the potential of the bit line R is changed within a range of higher than or equal to 0 V and lower than or equal to +4 V.

Figure 7C:
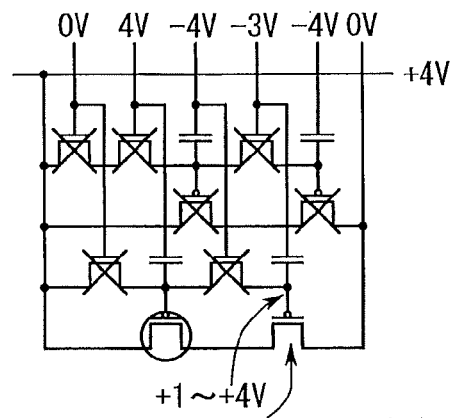

The data of the second memory cell from the right (the node F4) in the memory unit is read below. As illustrated in FIG. 7C, when the potential of the writing word line Q4 is increased to −3 V, the potential of the node F4 is set to +1 V, +2 V, +3 V, or +4 V in accordance with the written data. Here, when the potential of the node F4 is +4 V, the reading transistor RTr4 is turned off and current stops flowing between the bit line R and the bias line S.

At this stage, the potential of the node F4 is +4 V only in the case where the potential of the bit line is +3 V at the time of writing. That is, when the potential of the writing word line Q4 is +1 V and the reading transistor RTr4 is in an off state, it is found that the potential of the bit line R is +3 V at the time of writing. Thus, a value of data can be found.

Figure 7D:
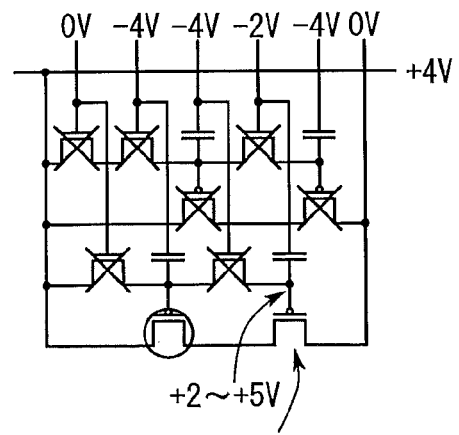

Further, as illustrated in FIG. 7D, when the potential of the writing word line Q4 is increased to −2 V, the potential of the node F4 is set to +2 V, +3 V, +4 V, or +5 V in accordance with the written data. Here, when the potential of the node F4 is +4 V or +5 V, the reading transistor RTr4 is turned off and current stops flowing between the bit line R and the bias line S. The potential of the node F4 is +4 V or +5 V only in the case where the potential of the bit line R is +2 V or +3 V at the time of writing.

Figure 7E:
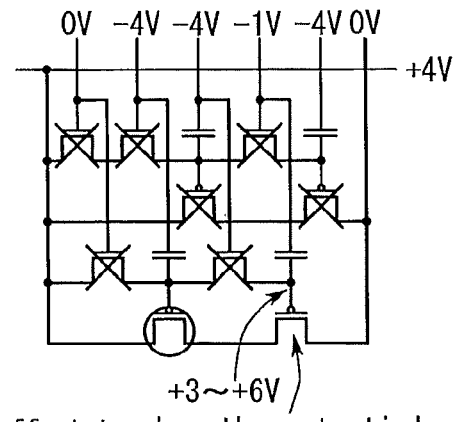

Similarly, as illustrated in FIG. 7E, when the potential of the writing word line Q4 is increased to −1 V, the potential of the node F4 is set to +3 V, +4 V, +5 V, or +6 V in accordance with the written data. Here, when the potential of the node F4 is +4 V, +5 V, or +6 V, the reading transistor RTr4 is turned off and current stops flowing between the bias line R and the bias line S. That is, the potential of the bit line R is +1 V, +2 V, or +3 V at the time of writing.

In the case where the potential of the bit line is 0 V at the time of writing, the potential of the node F4 is +3 V when the potential of the writing word line Q4 is set to −1 V, and the reading transistor RTr4 is still in an on state. That is, in the case where current flows between the bit line R and the bias line S even when the potential of the writing word line Q4 is +3 V, it is found that the potential of the bit line R is 0 V at the time of writing.

Note that as described in Embodiment 1, multivalued data can be read by connecting a capacitor to the bit line R and measuring the potential of the bit line R.

In this manner, the data (2 bits) at four stages can be written and read. Needless to say, much more data such as data (3 bits) at eight stages or data (4 bits) at 16 stages can be written and read in a similar manner.

In the above description, the parasitic capacitance and the gate capacitance of each of the reading transistors RTr1 to RTr4 are negligible as compared to the capacitance of each of the capacitors C1 to C4; however, voltage to be applied needs to be determined in view of such capacitance in an actual memory cell.

The gate capacitance of each of the reading transistors RTr1 to RTr4 in an on state and in an off state greatly varies; therefore, the potentials of the gates of the reading transistors RTr1 to RTr4 are influenced by the variation. As the ratio of the gate capacitance of each of the reading transistors RTr1 to RTr4 to the capacitance of each of the capacitors C1 to C4, respectively, is higher, the influence is bigger. Accordingly, the capacitance of each of the capacitors C1 to C4 is preferably larger than or equal to twice as large as the gate capacitance of each of the reading transistors RTr1 to RTr4, respectively.

(Embodiment 5)

Figure 11A:
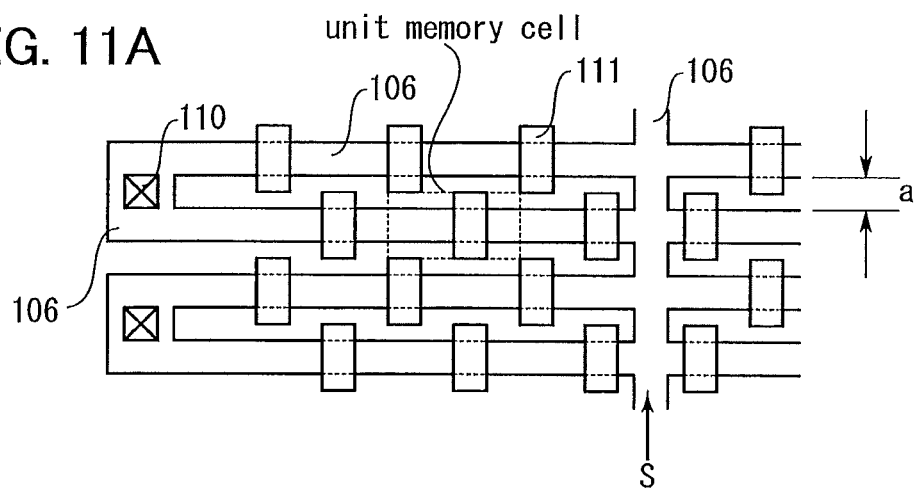
FIGS. 11A to 11C are diagrams illustrating an example of layout of wirings of a semiconductor memory device according to one embodiment of the present invention.
Figure 11B:
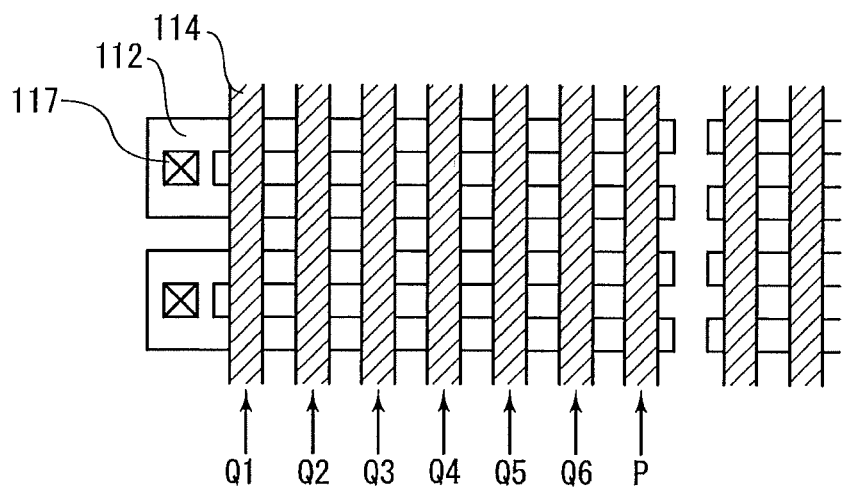
Figure 11C:
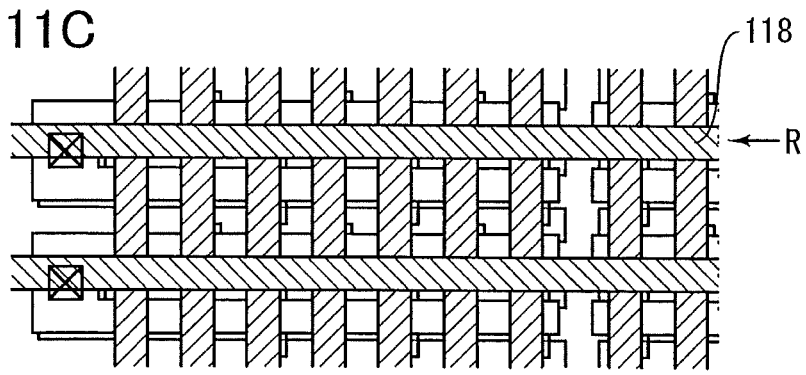

In this embodiment, a shape of the semiconductor memory device described in Embodiment 4 will be described. An example of layout of a memory unit of the semiconductor memory device in this embodiment is illustrated in FIGS. 11A to 11C. In this embodiment, a single memory unit includes six memory cells. Although the pattern of a wiring of the semiconductor memory device in this embodiment is different from that in Embodiment 3, the semiconductor memory device in this embodiment can be manufactured by the method described in Embodiment 3.

In FIG. 11A, main wirings, main electrodes, and the like provided over a single crystal silicon substrate are illustrated. The element separation region 102 is formed over the substrate. Further, the conductive region 106 is formed using a conductive material or doped silicon. Part of the conductive region 106 serves as a source and a drain of the reading transistor. Further, another part of the conductive region 106 serves as part of the bias line S. Some portions of the conductive region 106 are separated from each other by a gate electrode 111 of the reading transistor.

A connection electrode 110 is provided in part of the conductive region 106. As a material for the gate electrode 111 or the connection electrode 110, a material meeting the conditions of the gate electrode 111 or the connection electrode 110 described in Embodiment 3 may be used.

Figure 22:
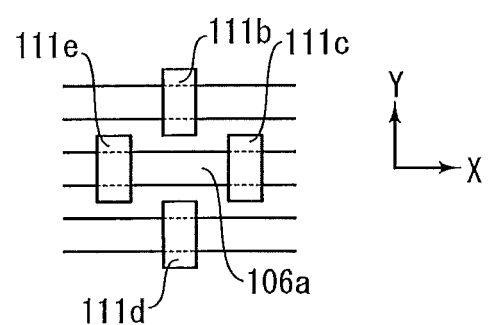
FIG. 22 is a diagram illustrating an example of layout of wirings of a semiconductor memory device according to one embodiment of the present invention.

A feature of this embodiment is a structure in which the gate electrodes 111 are provided alternately. As in FIG. 22, in four gate electrodes which are closest to a first conductive region 106a among the gate electrodes 111, that is, first to fourth gate electrodes 111b, 111c, 111d, and 111e, the first gate electrode 111b and the third gate electrode 111d overlap with each other in the direction vertical to the channel length (i.e., the Y direction in FIG. 22) and the first conductive region 106a is provided between the first gate electrode 111b and the third gate electrode 111d. In addition, the second gate electrode 111c and the fourth gate electrode 111e overlap with each other in the channel length direction (i.e., the X direction in FIG. 22) and the first conductive region 106a is provided between the second gate electrode 111c and the fourth gate electrode 111e.

As a result, the gate electrodes 111 can be provided more densely as compared with FIG. 8A. Since the gate electrodes 111 are provided in a straight line in FIG. 8A, an interval indicated by a in FIG. 8A needs to be twice (2F) the minimum feature size. However, in this embodiment, the interval can be the minimum feature size (F). Accordingly, while a width per unit memory cell is 3F in FIG. 8A, it can be 2F in this embodiment. Therefore, an area per unit memory cell can be $8F^2$.

Main wirings, main electrodes, and the like, focusing on the transistor including an oxide semiconductor, which is formed over the circuit illustrated in FIG. 11A, are illustrated in FIG. 11B. A plurality of island-shaped oxide semiconductor regions 112 and a plurality of wirings 114 are formed. The wirings 114 serve as the writing word lines Q1, Q2, Q3, Q4, Q5, and Q6 and the reading word line P.

Part of the wiring 114 overlaps with the oxide semiconductor and serves as a gate electrode of the writing transistor. The oxide semiconductor region 112 is in contact with the gate electrode 111 provided thereunder. Further, a capacitor is formed in a portion where part of the wiring 114 overlaps with the gate electrode 111. A connection electrode 117 for connecting to an upper layer (e.g., the bit line R) is provided in the oxide semiconductor region 112.

FIG. 11C illustrates a structure where the structure illustrated in FIG. 11A overlaps with the structure illustrated in FIG. 11B. In FIG. 11C, the structures are shifted a little from each other so as to see the overlap. Further, the wiring 118 formed over the transistor including an oxide semiconductor is also illustrated. The wiring 118 serves as the bit line R.

As described above, the area per memory cell is $8\ F^2$. The memory unit includes a portion shared by the memory cells, so that the area per memory cell is actually greater than $8\ F^2$. The memory unit illustrated in FIGS. 11A to 11C are provided with six memory cells; as the number of memory cells in a memory unit is increased, the area per memory cell becomes close to $8\ F^2$.

(Embodiment 6)

Figure 12A:
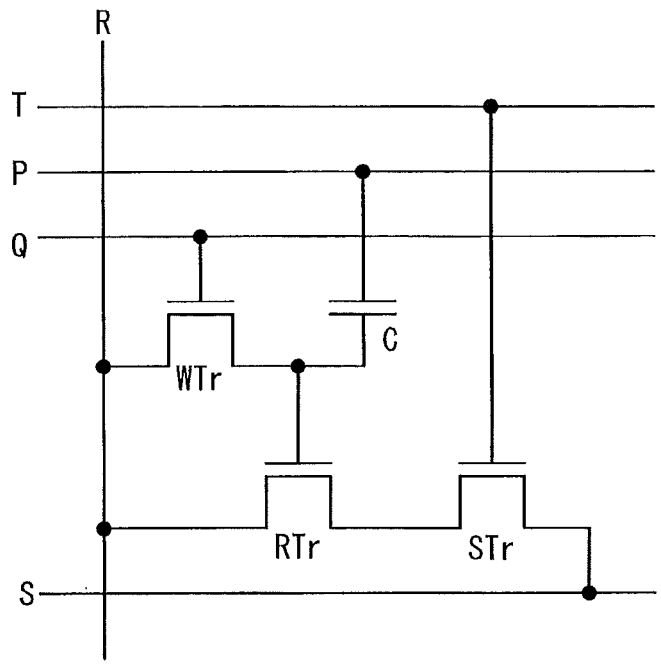
FIG. 12A is a diagram illustrating an example of a semiconductor memory device and FIGS. 12B to 12E are diagrams illustrating an example of a driving method of a semiconductor memory device according to one embodiment of the present invention.

In this embodiment, an operation example of the semiconductor memory circuit illustrated in FIG. 12A will be described with reference to FIGS. 12B to 12E. Note that specific numeric values of potentials are given below for understanding the technical idea of the present invention. Needless to say, such values are changed depending on a variety of characteristics of a transistor and a capacitor, or the convenience of a practitioner. In the semiconductor memory circuit illustrated in FIG. 12A, data can be written and read by a method other than the method described below.

Here, both the writing transistor WTr and the reading transistor RTr are p-channel transistors. Each of the writing transistor WTr and the reading transistor RTr is turned on (current flows) when the potential of the gate is higher than any one of the potentials of the source and the drain by 1 V or more, and turned off under the other conditions (current does not flow).

The fluctuation in the gate capacitance of the reading transistor RTr, which is caused by the gate bias, is negligible as compared to the capacitance of the capacitor C. Further, the parasitic capacitance of the writing transistor WTr, the parasitic capacitance of the reading transistor RTr, the parasitic capacitance generated between wirings, and the like, which are not illustrated in the drawings, are considered to be 0. In FIGS. 12B to 12E, a circle is on a transistor in an on state, and a cross mark is on a transistor in an off state. A description may be written in the drawings when a transistor is turned on under a specific condition. In the following examples, the potential of the bias line S is always 0V.

Figure 12B:
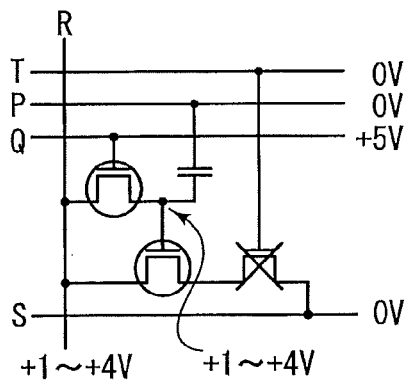

First, writing to a memory cell will be described. At the time of writing, as illustrated in FIG. 12B, potentials of the reading word line P and the selection line T are set to 0 V. A potential of the bit line R is set to a value at one of four levels of +1 V, +2 V, +3 V, and +4 V, in accordance with data to be written. When a potential of the writing word line Q is +5 V, the writing transistor WTr is turned on and a potential of the drain of the writing transistor WTr becomes close to a potential of the source of the writing transistor (i.e., the potential of the bit line R). Here, the potential of the drain of the writing transistor WTr becomes equal to the potential of the bit line R.

On the other hand, although the reading transistor RTr is in an on state at this stage, current does not flow between the bias line S and the bit line R because the selection transistor STr provided between the bias line S and the reading transistor RTr is in an off state. In this manner, data can be written.

Figure 12C:
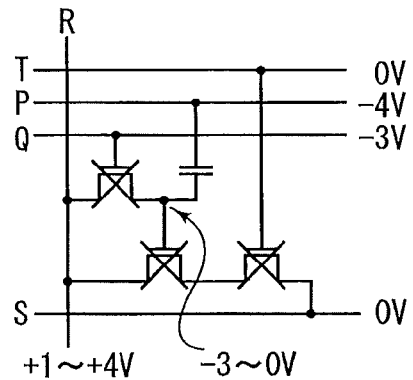

Next, in the case where writing is performed in a row other than the row, as illustrated in FIG. 12C, the potential of the writing word line Q is set to −3 V. In addition, the potential of the reading word line P is set to −4 V. The potential of the bit line R is set to a value at one of four levels of +1 V, +2 V, +3 V, and +4 V, in accordance with data to be written in the row where writing is performed.

Since the drain of the writing transistor WTr is connected to the reading word line P through the capacitor C, the potential of the drain of the writing transistor WTr is decreased by 4 V in accordance with change in the potential of the reading word line P (i.e., decrease in potential from 0 V, which is the state illustrated in FIG. 12B, to −4 V, which is the state illustrated in FIG. 12C). That is, the potential of the drain of the writing transistor WTr is set to −3 V, −2 V, −1 V, or 0 V, in accordance with the written data.

In this state, owing to relations between the potential (−3 V) of the gate of the writing transistor WTr, and the potential (0 V to +3 V) of the source of the writing transistor WTr (the potential of the bit line R) and the potential (−3 V to 0 V) of the drain of the writing transistor WTr, the writing transistor WTr is turned off.

Further, owing to relations between the potential (−3 V to 0 V) of the gate of the reading transistor RTr, and the potential (0 V to +3 V) of the source of the reading transistor RTr (i.e., the potential of the bit line R) and the potential (0 V) of the drain of the reading transistor RTr (i.e., the potential of the bias line S), the reading transistor RTr is turned off. In addition, since the selection transistor STr is in an off state, current does not flow between the bias line S and the bit line R.

Figure 12D:
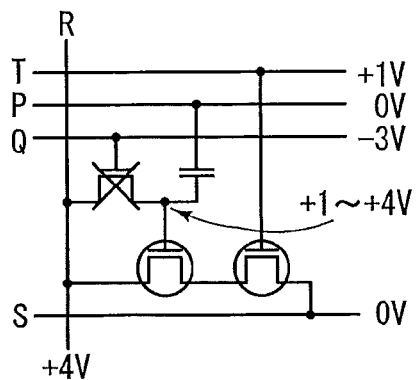
Figure 12E:
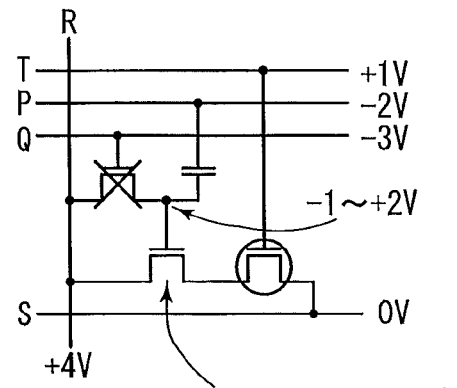

Next, reading will be described. As illustrated in FIG. 12D, the potential of the writing word line Q is set to −3 V and the potential of the selection line T is set to +1 V. Thus, the writing transistor WTr is turned off and the selection transistor STr is turned on. The potential of the reading word line P is set to 0 V and the potential of the bit line R is set to +4 V. In this state, the potential of the gate of the reading transistor RTr is set to +1 V, +2 V, +3 V, or +4 V in accordance with data written. When the gate of the reading transistor RTr is set to any of these potentials, the reading transistor RTr is turned on.

The potential of the gate of the reading transistor RTr changes in accordance with the potential of the reading word line P; thus, the reading transistor is turned on and turned off. For example, when the potential of the reading word line P is −2 V as in FIG. 12E, the potential of the gate of the reading transistor RTr is set to −1 V, 0 V, +1 V, or +2 V. When the potential of the gate of the reading transistor RTr is set to −1 V or 0 V, the reading transistor RTr is turned off.

When the reading transistor RTr is in an off state, current does not flow between the bias line S and the bit line R. By detection of that, the potential of the gate of the reading transistor RTr can be known. Alternatively, when a capacitor is provided in an end portion of the bit line R and current does not flow between the bias line S and the bit line R, the initial potential (+4 V) does not change, so that it can be known that the reading transistor RTr is in an off state.

In the case where the potential of the bit line R is +1 V or +2 V when writing is performed, the potential of the gate of the reading transistor RTr is −1 V or 0 V. That is, when the potential of the reading word line P is −2 V, current flows between the bias line S and the bit line R, which means that the potential of the bit line R is +1 V or +2 V when writing is performed.

Similarly, when the potential of the reading word line P is −1 V, the potential of the gate of the reading transistor RTr is 0 V, +1 V, +2V, or +3V. When the potential of the gate of the reading transistor RTr is 0 V, the reading transistor RTr is turned off. When the potential of the reading word line P is set to −3 V, the potential of the gate of the reading transistor RTr is −2 V, −1 V, 0 V, or +1 V. When the potential of the gate of the reading transistor RTr is −2 V, −1 V, or 0 V, the reading transistor RTr is turned off. Accordingly, the value of the potential applied at writing, that is, data supplied at writing, can be known.

In this manner, the data (2 bits) at four stages can be written and read. Needless to say, in a similar manner, much more data such as data (3 bits) at eight stages or data (4 bits) at 16 stages can be written and read. Alternatively, data (1 bit) at two stages can be written and read.

In the above description, although the parasitic capacitance and the gate capacitance of the reading transistor RTr are negligible as compared to the capacitance of the capacitor C, voltage to be applied needs to be determined in view of such capacitance in an actual memory cell.

The gate capacitance of the reading transistor RTr in an on state and in an off state greatly varies; therefore, the potential of the gate of the reading transistor RTr is influenced by the variation. As the ratio of the gate capacitance of the reading transistor RTr to the capacitance of the capacitor C is higher, the influence is bigger. Accordingly, the capacitance of the capacitor C is preferably larger than or equal to twice as large as the gate capacitance of the reading transistor RTr.

Note that in order that data at some stages (multivalued data) be stored by making the amount of the charge held in the memory cell be at a plurality of stages, it is necessary that variation in the amount of the charge held is small. In the semiconductor memory circuit and the semiconductor memory device which are described in this embodiment, variation in the amount of the charge held is small, which is suitable for this purpose.

(Embodiment 7)

Figure 13A:
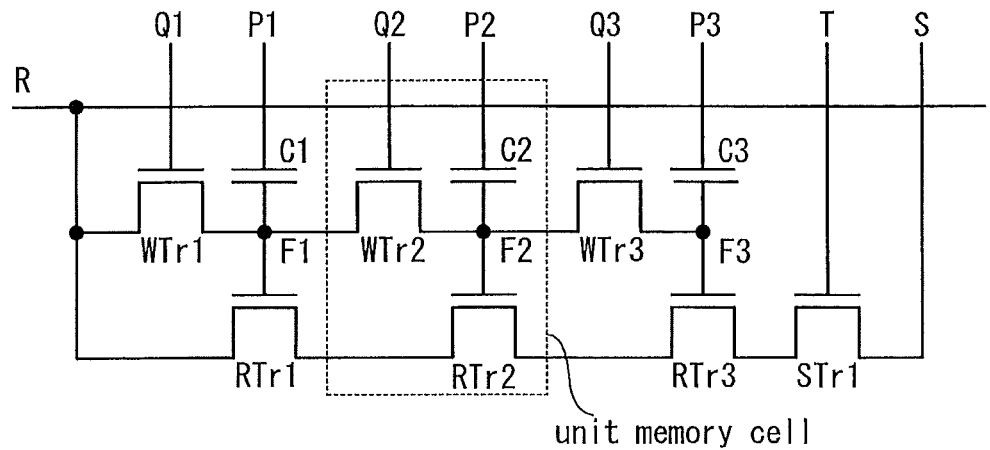
FIGS. 13A to 13C are diagrams each illustrating an example of semiconductor memory devices according to one embodiment of the present invention.
Figure 13B:
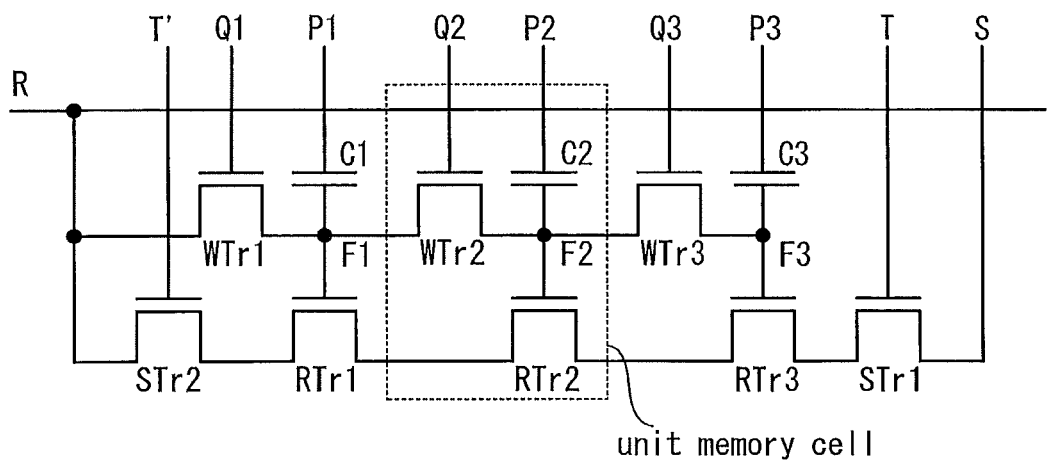
Figure 13C:
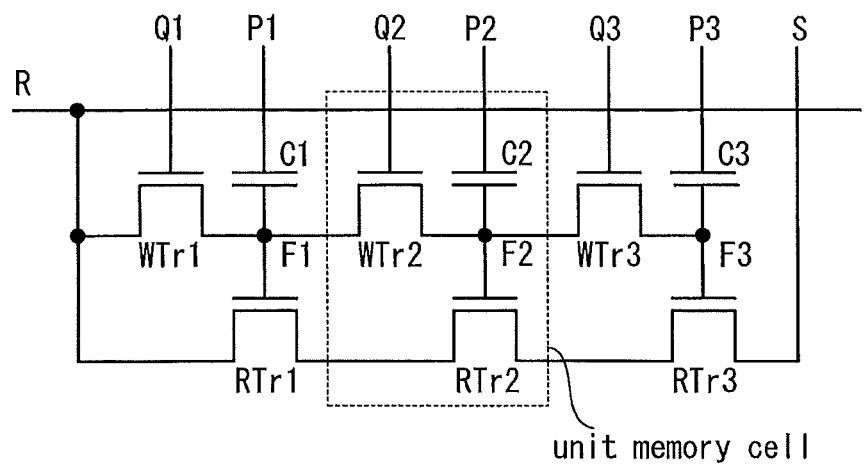

In this embodiment, an operation example of the semiconductor memory circuit illustrated in FIG. 13A will be described with reference to FIGS. 14A to 14D and FIGS. 15A to 15D. Note that specific numeric values of potentials are given below for understanding the technical idea of the present invention. Needless to say, such values are changed depending on a variety of characteristics of a transistor and a capacitor, or the convenience of a practitioner. In the semiconductor memory circuit illustrated in FIG. 13A, data can be written and read by a method other than the method described below.

Here, the writing transistors WTr1, WTr2, and WTr3 and the reading transistors RTr1, RTr2, and RTr3 are n-channel transistors. Each of the writing transistors WTr1, WTr2, and WTr3 and the reading transistors RTr1, RTr2, and RTr3 is turned on when the potential of the gate is higher than any one of the potentials of the source and the drain by 1 V or more, and turned off under the other conditions.

The fluctuation in the gate capacitance of each of the reading transistors RTr1, RTr2, and RTr3, which is caused by the gate bias, is negligible as compared to the capacitance of each of the capacitors C1, C2, and C3. Further, the parasitic capacitance of the writing transistors WTr1, WTr2, and WTr3, the parasitic capacitance of the reading transistors RTr1, RTr2, and RTr3, the parasitic capacitance generated between wirings, and the like, which are not illustrated in the drawings, are considered to be 0.

In FIGS. 14A to 14D and FIGS. 15A to 15D, a circle is on a transistor in an on state, and a cross mark is on a transistor in an off state. A description may be written in the drawings when a transistor is turned on under a specific condition. In the following examples, the potential of the bias line S is always 0V.

Figure 14A:
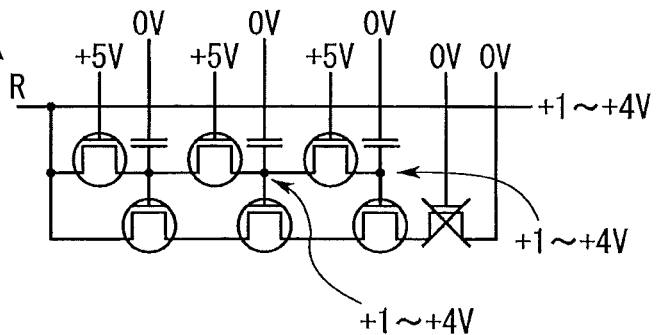
FIGS. 14A to 14D are diagrams illustrating an example of a driving method (writing) of a semiconductor memory device according to one embodiment of the present invention.

First, writing to a memory cell will be described. Writing is started from the rightmost memory cell. At the time of writing, as illustrated in FIG. 14A, potentials of the reading word lines P1, P2, and P3, and the selection line T are set to 0 V. A potential of the bit line R is set to a value at one of four levels of +1 V, +2 V, +3 V, and +4 V, in accordance with data to be written.

Then, potentials of writing word lines Q1, Q2, and Q3 are set to +5 V, whereby the writing transistors WTr1, WTr2, and WTr3 are turned on and the potential of the drain of the writing transistor WTr3 (i.e., the potential of the node F3) becomes close to the potential of the bit line R. Here, the potential of the drain of the writing transistor WTr3 becomes equal to the potential of the bit line R.

On the other hand, at this stage, the reading transistors RTr1, RTr2, and RTr3 are in an on state and the selection transistor STr1 is in an off state. Thus, current does not flow between the bit line R and the bias line S.

Figure 14B:
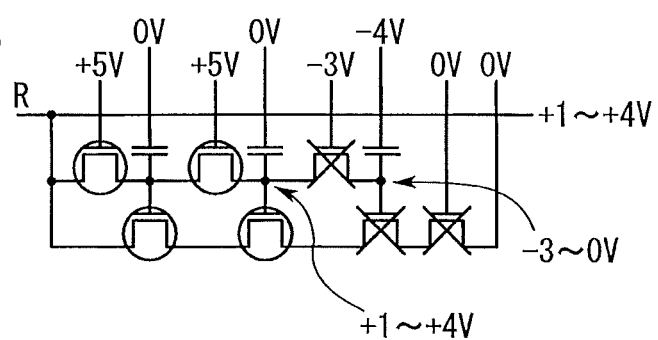
Figure 14C:
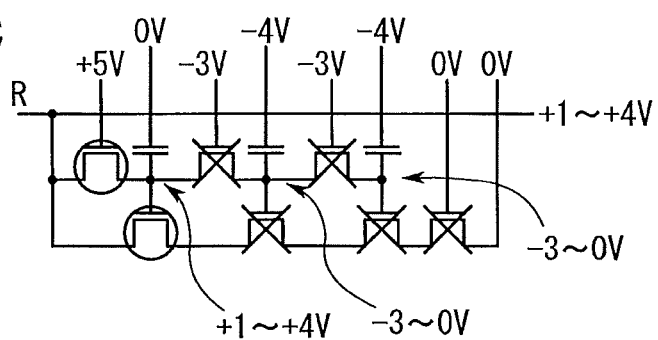

Next, as illustrated in FIG. 14B, the potential of the writing word line Q3 is set to −3 V. Accordingly, the writing transistor WTr3 is turned off and the potential of the bit line R just before the writing transistor WTr3 is turned off is held in the node F3. Further, the potential of the reading word line P3 is set to −4 V. As a result, the potential of the node F3 is set to −3 V, −2 V, −1 V, or 0 V in accordance with the written data. Thus, the reading transistor RTr3 is turned off. In this manner, data can be written in the rightmost memory cell.

Next, data is written in the central memory cell. In a state illustrated in FIG. 14B, the potential of the node F2 is equal to the potential of the bit line R. Then, when the potential of the writing word line Q2 is set to −3 V (see FIG. 14C), the writing transistor WTr2 is turned off and the potential of the bit line R just before the writing transistor WTr2 is turned off is held in the node F2. Further, the potential of the reading word line P2 is set to −4 V. As a result, the potential of the node F2 is set to −3 V, −2 V, −1 V, or 0 V in accordance with the written data. The reading transistor RTr2 is turned off. In this manner, data can be written in the central memory cell.

Figure 14D:
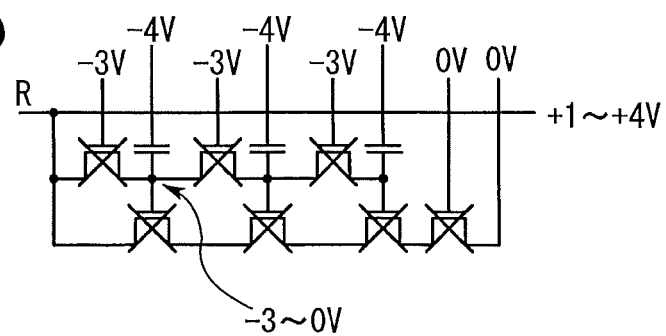

In such a manner, data can be written in all the memory cells. After the writing is completed, the writing transistors WTr1, WTr2, and WTr3 and the reading transistors RTr1, RTr2, and RTr3 all are in an off state as illustrated in FIG. 14D.

Next, reading will be described. First, in the case where reading is performed in a row other than the row including the memory unit, as illustrated in FIG. 14D, the potentials of the writing word lines Q1, Q2, and Q3 are set to −3 V, and the potentials of the reading word lines P1, P2, and P3 are set to −4 V. Accordingly, the writing transistors WTr1, WTr2, and WTr3 are turned off. Further, the potentials of the nodes F1, F2, and F3 are higher than or equal to −3 V and lower than or equal to 0 V. Since the potential of the bit line R is higher than or equal to 0 V and lower than or equal to +4 V as described later, the reading transistors RTr1, RTr2, and RTr3 can remain in an off state.

Figure 15A:
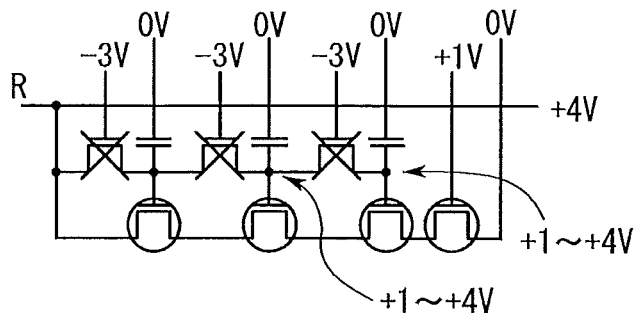
FIGS. 15A to 15D are diagrams illustrating an example of a driving method (reading) of a semiconductor memory device according to one embodiment of the present invention.

In the case where reading is performed in the memory unit, as illustrated in FIG. 15A, the potentials of the writing word lines Q1, Q2, and Q3 are set to −3 V, and the potentials of the reading word lines P1, P2, and P3 are set to 0 V. The potential of the bit line is set to +4 V. At this time, the writing transistors WTr1, WTr2, and WTr3 are in an off state. The potentials of the nodes F1, F2, and F3 are higher than or equal to +1 V and lower than or equal to +4 V, so that the reading transistors RTr1, RTr2, and RTr3 are turned on. Therefore, current flows between the bit line R and the bias line S.

In the case where a capacitor is provided in an end portion of the bit line R, the initial potential (+4 V) of the bit line R becomes close to the potential (0 V) of the bias line S when current flows between the bit line R and the bias line S. That is, the potential of the bit line R is changed within a range of higher than or equal to 0 V and lower than or equal to +4 V.

Figure 15B:
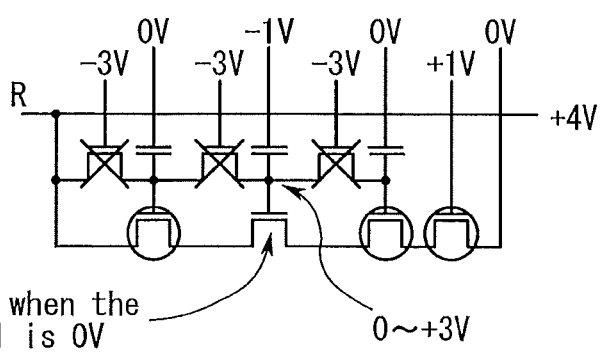

The data of the central memory cell in the memory unit is read below. As illustrated in FIG. 15B, when the potential of the reading word line P2 is decreased to −1 V, the potential of the node F2 is set to 0 V, +1 V, +2 V, or +3 V, in accordance with the written data. Here, when the potential of the node F2 is 0 V, the reading transistor RTr2 is turned off and current stops flowing between the bit line R and the bias line S.

At this stage, the potential of the node F2 is +4 V only in the case where the potential of the bit line is +1 V at the time of writing. That is, when the potential of the reading word line P2 is +1 V and the reading transistor RTr2 is in an off state, it is found that the potential of the bit line R is +1 V at the time of writing. Thus, a value of held data can be found.

Figure 15C:
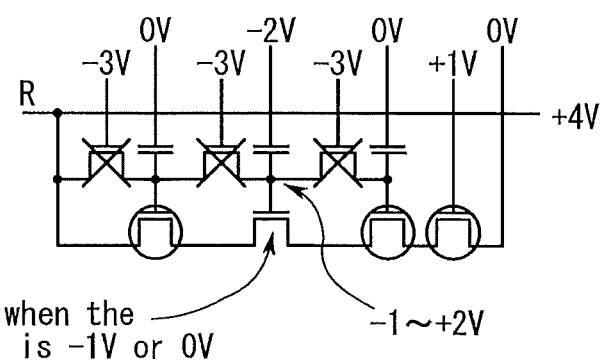

As illustrated in FIG. 15C, when the potential of the reading word line P2 is decreased to −2 V, the potential of the node F2 is set to −1 V, 0 V, +1 V, or +2 V, in accordance with the written data. Here, when the potential of the node F2 is −1 V or 0 V, the reading transistor RTr2 is turned off and current stops flowing between the bit line R and the bias line S.

By detection of that, a value of the data can be known. That is, the potential of the gate of the reading transistor RTr2 is −1 V or 0 V at this stage only in the case where the potential of the bit line R is +1 V or +2 V at the time of writing. In the case where the reading transistor RTr2 is in an on state with the potential of the reading word line P2 of −1 V (i.e., the state illustrated in FIG. 15B) but is in an off state with the potential of the reading word line P2 of −2 V, the potential of the bit line R is +2 V at the time of writing.

Figure 15D:
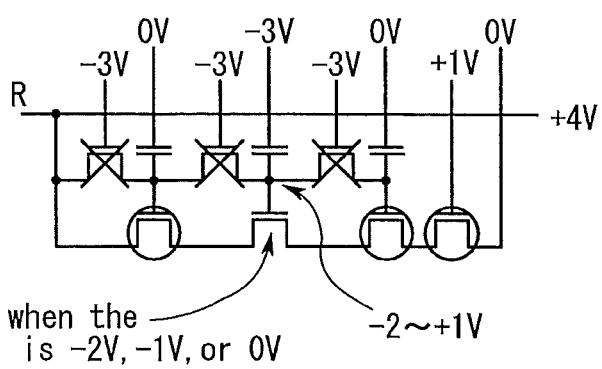
Figure 16:
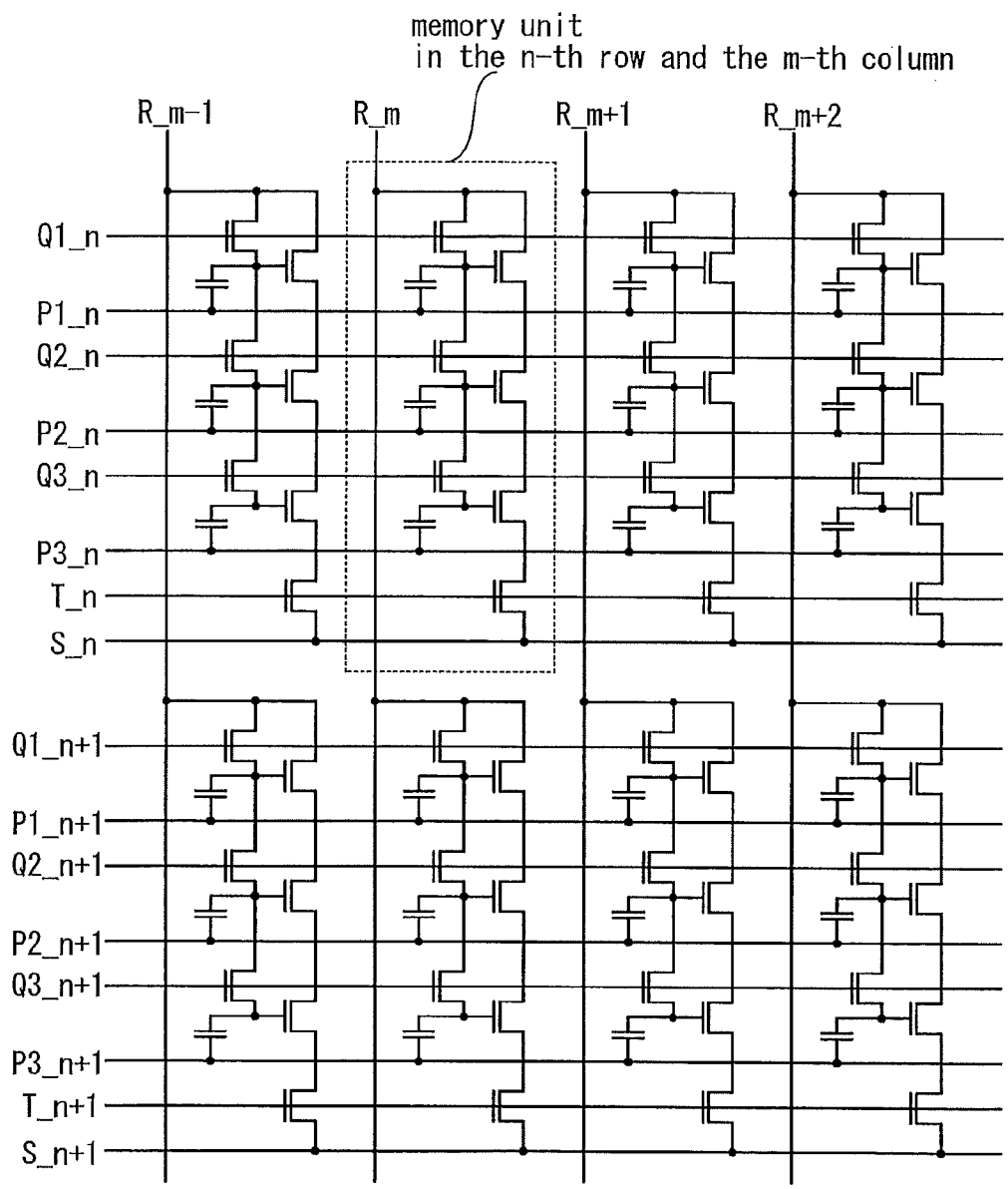
FIG. 16 is a diagram illustrating an example of a semiconductor memory device according to one embodiment of the present invention.

Similarly, as illustrated in FIG. 15D, when the potential of the reading word line P2 is decreased to −3 V, the potential of the node F2 is set to −2 V, −1 V, 0 V, or +1 V in accordance with the written data. Here, when the potential of the node F2 is −2 V, −1 V, or 0 V, the reading transistor RTr2 is turned off and current stops flowing between the bit line R and the bias line S. That is, the potential of the bit line is +1 V, +2 V, or +3 V at the time of writing.

In the case where the potential of the bit line is +4 V at the time of writing, the potential of the node F2 is +1 V when the potential of the reading word line P2 is set to −3 V, and the reading transistor RTr2 is still in an on state. That is, in the case where current flows between the bit line R and the bias line S even when the potential of the reading word line P2 is −3 V, it is found that the potential of the bit line is +4 V at the time of writing.

In this manner, the data (2 bits) at four stages can be written and read. Needless to say, in a similar manner, much more data such as data (3 bits) at eight stages or data (4 bits) at 16 stages can be written and read. Alternatively, data (1 bit) at two stages can be written and read.

In the above description, although the parasitic capacitance and the gate capacitance of each of the reading transistors RTr1, RTr2, and RTr3 are negligible as compared to the capacitance of each of the capacitors C1, C2, and C3, voltage to be applied needs to be determined in view of such capacitance in an actual memory cell.

The gate capacitance of each of the reading transistors RTr1, RTr2, and RTr3 in an on state and in an off state greatly varies; therefore, the potentials of the gates of the reading transistors RTr1, RTr2, and RTr3 are influenced by the variation. As the ratio of the gate capacitance of each of the reading transistors RTr1, RTr2, and RTr3 to the capacitance of each of the capacitors C1, C2, and C3, respectively, is higher, the influence is bigger. Accordingly, the capacitance of each of the capacitors C1, C2, and C3 is preferably larger than or equal to twice as large as the gate capacitance of each of the reading transistors RTr1, RTr2, and RTr3, respectively.

(Embodiment 8)

In this embodiment, an example of a shape of the semiconductor memory device described in Embodiment 7 will be described. In this embodiment, an oxide semiconductor containing gallium and indium is used for a writing transistor and a single crystal silicon semiconductor is used for a reading transistor. Therefore, the writing transistor is stacked over the reading transistor as in Embodiment 3.

Figure 20A:
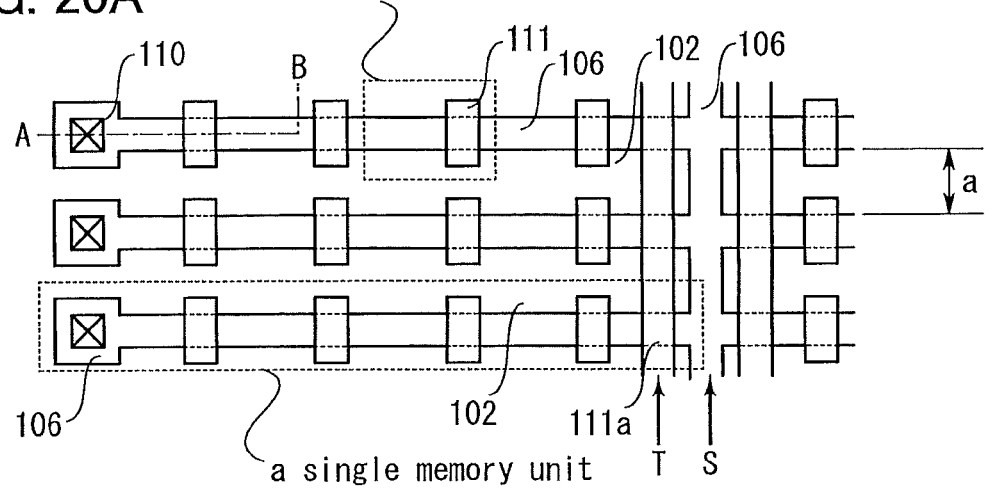
FIGS. 20A to 20C are diagrams illustrating an example of layout of wirings of a semiconductor memory device according to one embodiment of the present invention.
Figure 20B:
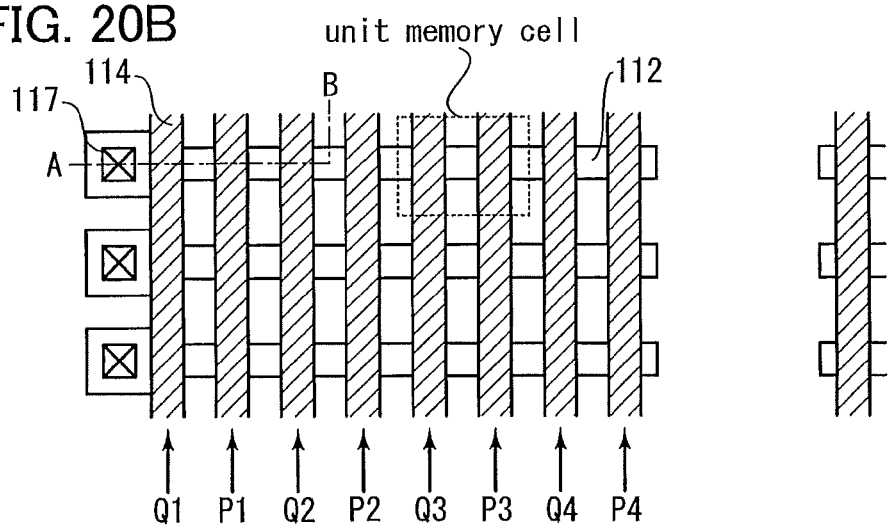
Figure 20C:
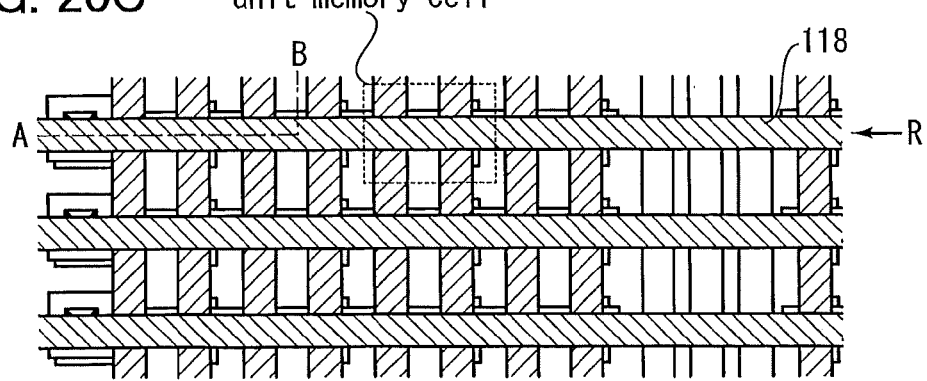

An example of layout of a memory unit of the semiconductor memory device in this embodiment is illustrated in FIGS. 20A to 20C. In this embodiment, a single memory unit includes four memory cells.

In FIG. 20A, main wirings, main electrodes, and the like provided over a single crystal silicon substrate are illustrated. The element separation region 102 is formed over the substrate. Over the substrate, the conductive region 106 is formed using a conductive material or doped silicon. Part of the conductive region 106 serves as a source and a drain of the reading transistor. Further, another part of the conductive region 106 serves as part of the bias line S. Some portions of the conductive region 106 are separated from each other by the gate electrode 111 or a gate electrode 111a of the reading transistor. A connection electrode 110 is provided in part of the conductive region 106.

Note that the gate electrode 111a serves as a gate electrode of a selection transistor and forms the selection line T. The gate electrode 111 and the gate electrode 111a are preferably formed using the same material at the same time.

When the bias line S is formed with the use of the conductive region 106, the integration degree can be increased. In that case, the bias line S needs to be provided so as to be parallel to a writing word line and a reading word line (that is, orthogonal to a bit line). Note that as illustrated, the integration degree can be increased in such a manner that a memory unit shares one bias line S with an adjacent memory unit.

Main wirings, main electrodes, and the like, focusing on the transistor including an oxide semiconductor, which is formed over the circuit illustrated in FIG. 20A, are illustrated in FIG. 20B. A plurality of island-shaped oxide semiconductor regions 112 and a plurality of wirings 114 are formed. The wirings 114 serve as the writing word lines Q1, Q2, Q3, and Q4 and the reading word lines P1, P2, P3, and P4.

Part of the wiring 114 overlaps with the oxide semiconductor and serves as the gate electrode of the writing transistor. The oxide semiconductor region 112 is in contact with the gate electrode 111 provided thereunder. Further, a capacitor is formed in a portion where part of the wiring 114 overlaps with the gate electrode 111. The connection electrode 117 for connecting to an upper layer (e.g., the bit line R) is provided in part of the oxide semiconductor region 112.

FIG. 20C illustrates a structure where the structure illustrated in FIG. 20A overlaps with the structure illustrated in FIG. 20B. In FIG. 20C, the structures are shifted a little from each other so as to see the overlap. Further, the wiring 118 formed over the transistor including an oxide semiconductor is also illustrated. The wiring 118 serves as the bit line R.

Note that a dot A and a dot B denote the same positions through FIGS. 20A to 20C. In FIGS. 20A to 20C, the width of the conductive region 106 and the wiring 114 are processed to have the minimum feature size F. That is, the line width and the line interval are F. In that case, the size of the unit memory cell is 12 $F^2$. Embodiment 3 can be referred to for a manufacturing method of the semiconductor memory device with the above structure.

(Embodiment 9)

Figure 17A:
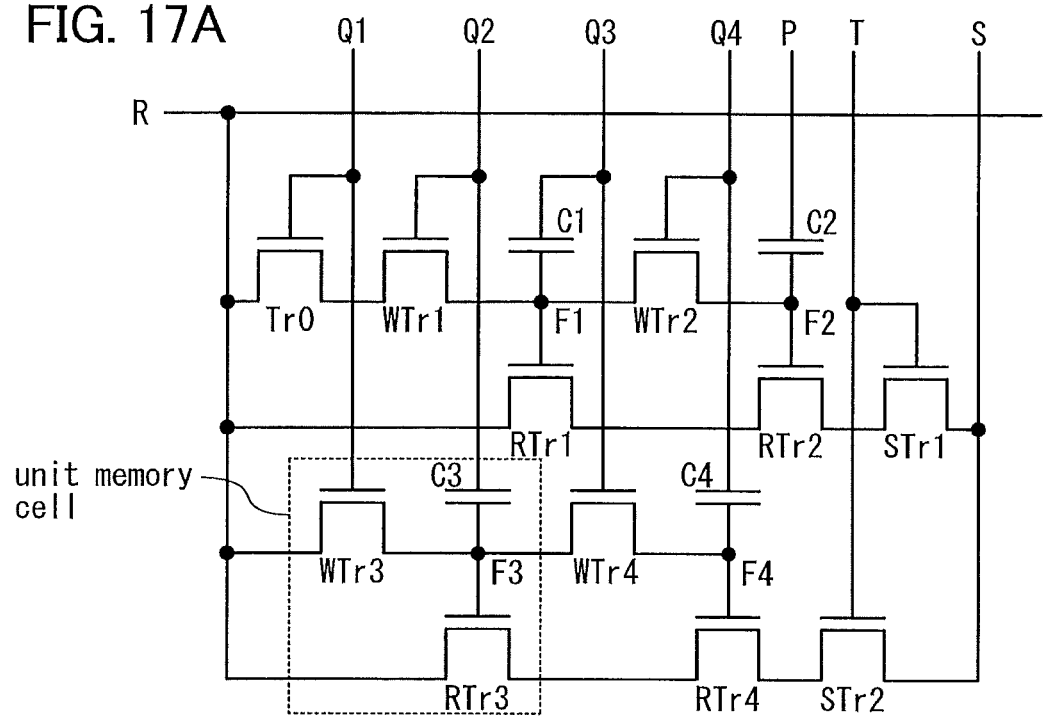
FIGS. 17A and 17B are diagrams each illustrating an example of a semiconductor memory device according to one embodiment of the present invention.

In this embodiment, an operation example of the semiconductor memory circuit illustrated in FIG. 17A will be described with reference to FIGS. 18A to 18C and FIGS. 19A to 19C. There is only one difference between the circuit in FIG. 17A and a circuit in FIG. 17B in that the circuit in FIG. 17A has two selection transistors performing the same operation and the circuit in FIG. 17B has one selection transistor. Therefore, in the circuit illustrated in FIG. 17B, data can be similarly written and read by the following method.

Note that specific numeric values of potentials are given below for understanding the technical idea of the present invention. Needless to say, such values are changed depending on a variety of characteristics of a transistor and a capacitor, or the convenience of a practitioner. In the semiconductor memory circuit illustrated in FIG. 17A (or FIG. 17B), data can be written and read by a method other than the method described below.

Here, the transistor Tr0, the writing transistors WTr1, WTr2, WTr3, and WTr4 and the reading transistors RTr1, RTr2, RTr3, and RTr4 are n-channel transistors. Each of the n-channel transistors is turned on when the potential of the gate is higher than any one of the potentials of the source and the drain by 1 V or more, and turned off under the other conditions.

The fluctuation in the gate capacitance of each of the reading transistors RTr1, RTr2, RTr3, and RTr4, which is caused by the gate bias, is negligible as compared to the capacitance of each of the capacitors C1, C2, C3, and C4. Further, the parasitic capacitance of the writing transistors WTr1, WTr2, and WTr3, WTr4, the parasitic capacitance of the reading transistors RTr1, RTr2, RTr3, and RTr4, the parasitic capacitance generated between wirings, and the like, which are not illustrated in the drawings, are considered to be 0.

In FIGS. 18A to 18C and FIGS. 19A to 19C, a circle is on a transistor in an on state, and a cross mark is on a transistor in an off state. A description may be written in the drawings when a transistor is turned on under a specific condition. In the following examples, the potential of the bias line S is always 0V.

Figure 18A:
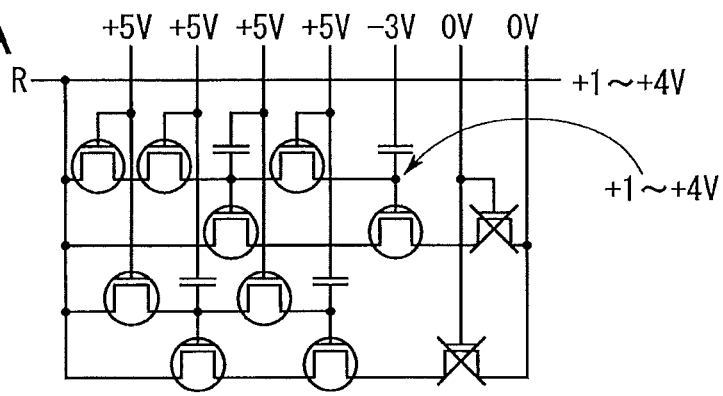
FIGS. 18A to 18C are diagrams illustrating an example of a driving method (writing) of a semiconductor memory device according to one embodiment of the present invention.

Writing is started from the rightmost memory cell. At the time of writing, as illustrated in FIG. 18A, the potentials of the writing word lines Q1, Q2, Q3, and Q4 are set to +5 V, the potential of the reading word line P is set to −3 V, and the potential of the selection line T is set to 0 V. The potential of the bit line R is set to a value at one of four levels of +1 V, +2 V, +3 V, and +4 V in accordance with data to be written.

In this state, the transistor Tr0, the writing transistors WTr1, WTr2, WTr3, and WTr4, and the reading transistors RTr1, RTr2, RTr3, and RTr4 are turned on and the potential of the node F2 becomes close to the potential of the bit line R. Here, the potential of the node F2 becomes equal to the potential of the bit line R. On the other hand, the selection transistors STr1 and STr2 are always in an off state at the time of writing; thus, current does not flow between the bias line S and the bit line R.

Figure 18B:
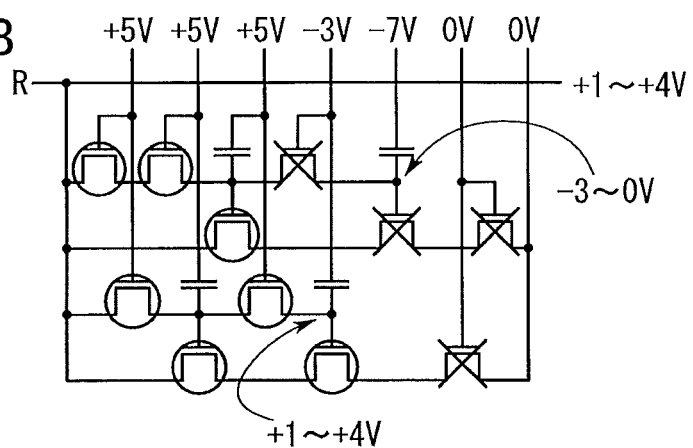
Figure 18C:
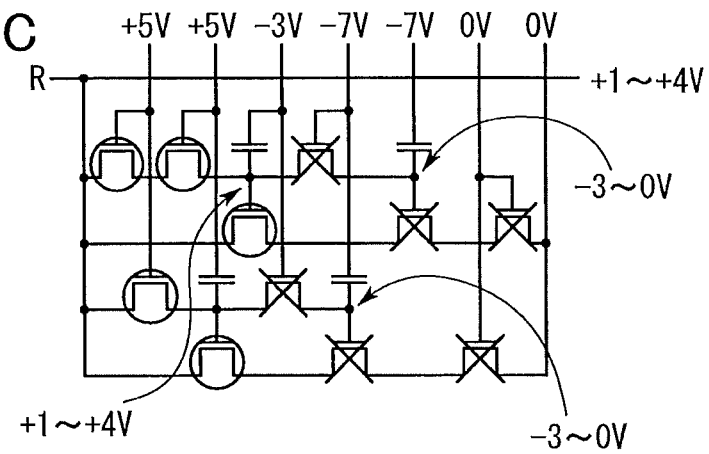

Next, as illustrated in FIG. 18B, the potential of the writing word line Q4 is set to −3 V. Accordingly, the writing transistor WTr2 is turned off and the potential of the bit line R just before the writing transistor WTr2 is turned off is held in the node F2. Further, when the potential of the reading word line P is decreased to −7 V, the potential of the node F2 is set to −3 V, −2 V, −1 V, or 0 V in accordance with the written data. Thus, the writing transistor WTr2 and the reading transistor RTr2 are turned off. In this manner, data can be written in the rightmost memory cell.

Next, data is written in the second memory cell from the right (the node F4). In a state illustrated in FIG. 18B, the potential of the node F4 becomes equal to the potential of the bit line R. Then, when the potential of the writing word line Q3 is set to −3 V (see FIG. 18C), the writing transistor WTr4 is turned off and the potential of the bit line R just before the writing transistor WTr4 is turned off is held in the node F4.

Further, when the potential of the writing word line Q4 is decreased to −7 V, the potential of the node F4 is set to −3 V, −2 V, −1 V, or 0 V in accordance with the written data. Thus, the writing transistor WTr4 and the reading transistor RTr4 are turned off. In this manner, data can be written in the second memory cell from the right. Data is sequentially written in other memory cells and thus data can be written in all the memory cells.

In the case where writing operation in the memory unit is not required, the potentials of the writing word lines Q1, Q2, Q3, and Q4 may be set to −7 V and the potential of the reading word line P may be set to −7 V. At this time, the potentials of the nodes F1, F2, F3, and F4 become higher than or equal to −3 V and lower than or equal to 0 V. Since the potential of the bit line R is higher than or equal to +1 V and lower than or equal to +4 V, the writing transistors WTr1, WTr2, WTr3, and WTr4 and the reading transistors RTr1, RTr2, RTr3, and RTr4 can remain in an off state.

Next, reading will be described with reference to FIGS. 19A to 19C. First, in the case where reading is performed in a row other than the row including the memory unit, the potentials of the writing word lines Q1, Q2, Q3, and Q4 are set to −7 V, and the potential of the reading word line P is set to −7 V. Accordingly, the transistor Tr0, the writing transistors WTr1, WTr2, WTr3, and WTr4 are turned off. Further, the potentials of the nodes F1, F2, F3, and F4 are higher than or equal to −3 V and lower than or equal to 0 V. Since the potential of the bit line R is higher than or equal to 0 V and lower than or equal to +4 V as described later, the reading transistors RTr1, RTr2, RTr3, and RTr4 can remain in an off state.

Figure 19A:
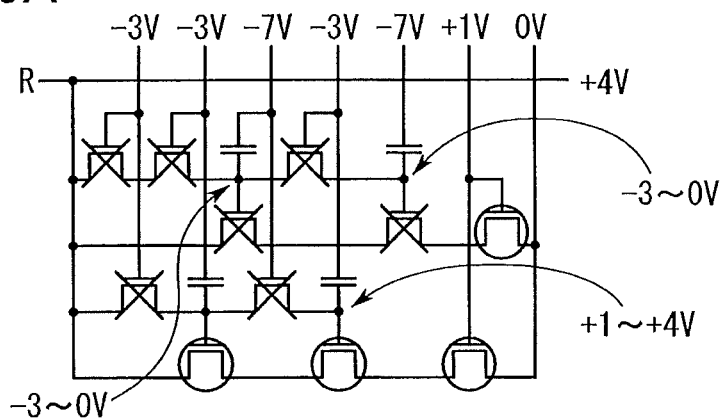
FIGS. 19A to 19C are diagrams illustrating an example of a driving method (reading) of a semiconductor memory device according to one embodiment of the present invention.
Figure 19B:
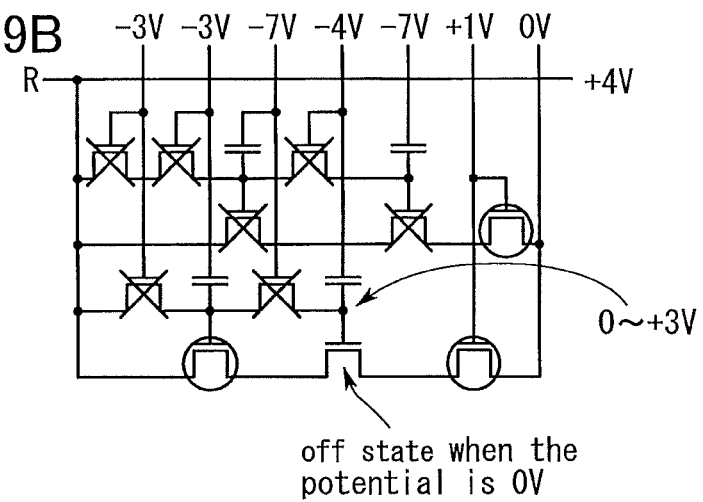

In the case where reading is performed in the memory unit, as illustrated in FIG. 19A, the potentials of the writing word lines Q1, Q2, and Q4 are set to −3 V, the potential of the writing word line Q3 is set to −7 V, the potential of the reading word line P is set to −7 V, and the potential of the selection line T is set to +1 V. Further, the potential of the bit line is set to +4 V.

At this time, the transistor Tr0, the writing transistors WTr1, WTr2, WTr3, and WTr4 are in an off state. The potentials of the nodes F1 and F2 are higher than or equal to −3 V and lower than or equal to 0 V, so that the reading transistors RTr1 and RTr2 are turned off. On the other hand, the potentials of the nodes F3 and F4 are higher than or equal to +1 V and lower than or equal to +4 V, so that the reading transistors RTr3 and RTr4 are turned on. Therefore, current flows between the bit line R and the bias line S.

In the case where a capacitor is provided in an end portion of the bit line R, the initial potential (+4 V) of the bit line R becomes close to the potential (0 V) of the bias line S when current flows between the bit line R and the bias line S. Therefore, the potential of the bit line R is changed within a range of higher than or equal to 0 V and lower than or equal to +4 V.

The data of the second memory cell from the right (the node F4) in the memory unit is read below. As illustrated in FIG. 19B, when the potential of the writing word line Q4 is decreased to −4 V, the potential of the node F4 is set to 0 V, +1 V, +2 V, or +3 V, in accordance with the written data. Here, when the potential of the node F4 is 0 V, the reading transistor RTr4 is turned off and current stops flowing between the bit line R and the bias line S.

At this stage, the potential of the node F4 is 0 V only in the case where the potential of the bit line is +1 V at the time of writing. That is, when the potential of the writing word line Q4 is +1 V and the reading transistor RTr4 is in an off state, it is found that the potential of the bit line R is +1 V at the time of writing. Thus, a value of held data can be found.

Figure 19C:
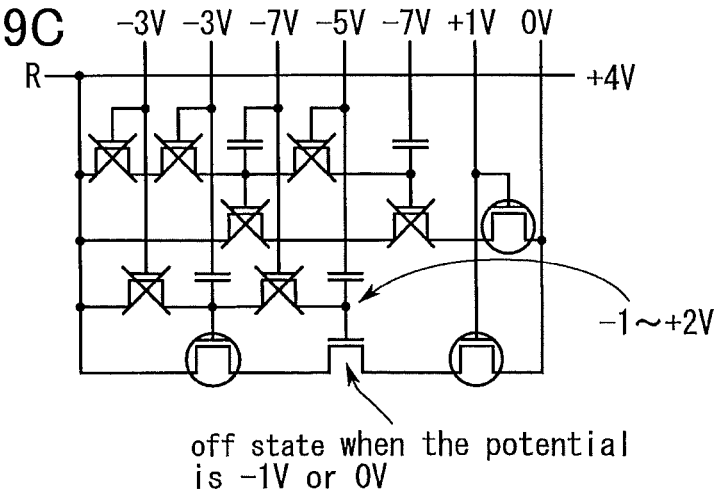

As illustrated in FIG. 19C, when the potential of the writing word line Q4 is decreased to −5 V, the potential of the node F4 is set to −1 V, 0 V, +1 V, or +2 V, in accordance with the written data. Here, when the potential of the node F4 is −1 V or 0 V, the reading transistor RTr4 is turned off and current stops flowing between the bias line R and the bias line S. The potential of the node F4 becomes −1 V or 0 V when the potential of the bit line R is +1 V or +2 V at the time of writing.

Similarly, when the potential of the writing word line Q4 is decreased to −6 V, the potential of the node F4 is set to −2 V, −1 V, 0 V, or +1 V in accordance with the written data. Here, when the potential of the node F4 is −2 V, −1 V, or 0 V, the reading transistor RTr4 is turned off and current stops flowing between the bit line R and the bias line S. That is, the potential of the bit line R is +1 V, +2 V, or +3 V at the time of writing.

In the case where the potential of the bit line is +4 V at the time of writing, the potential of the node F4 is +1 V when the potential of the writing word line Q4 is set to −6 V, and the reading transistor RTr4 is still in an on state. That is, in the case where current flows between the bit line R and the bias line S even when the potential of the writing word line Q4 is −6 V, it is found that the potential of the bit line R is +4 V at the time of writing.

In this manner, the data (2 bits) at four stages can be written and read. Needless to say, in a similar manner, much more data such as data (3 bits) at eight stages or data (4 bits) at 16 stages can be written and read. Alternatively, data (1 bit) at two stages can be written and read.

In the above description, although the parasitic capacitance and the gate capacitance of each of the reading transistors RTr1, RTr2, RTr3, and RTr4 are negligible as compared to the capacitance of each of the capacitors C1, C2, C3, and C4, voltage to be applied needs to be determined in view of such capacitance in an actual memory cell.

The gate capacitance of each of the reading transistors RTr1, RTr2, RTr3, and RTr4 in an on state and in an off state greatly varies; therefore, the potentials of the gates of the reading transistors RTr1, RTr2, RTr3, and RTr4 are influenced by the variation. As the ratio of the gate capacitance of each of the reading transistors RTr1, RTr2, RTr3, and RTr4 to the capacitance of each of the capacitors C1, C2, C3, and C4 is higher, the influence is bigger. Accordingly, the capacitance of each of the capacitors C1, C2, C3, and C4 is preferably larger than or equal to twice as large as the gate capacitance of each of the reading transistors RTr1, RTr2, RTr3, and RTr4, respectively.

(Embodiment 10)

Figure 21A:
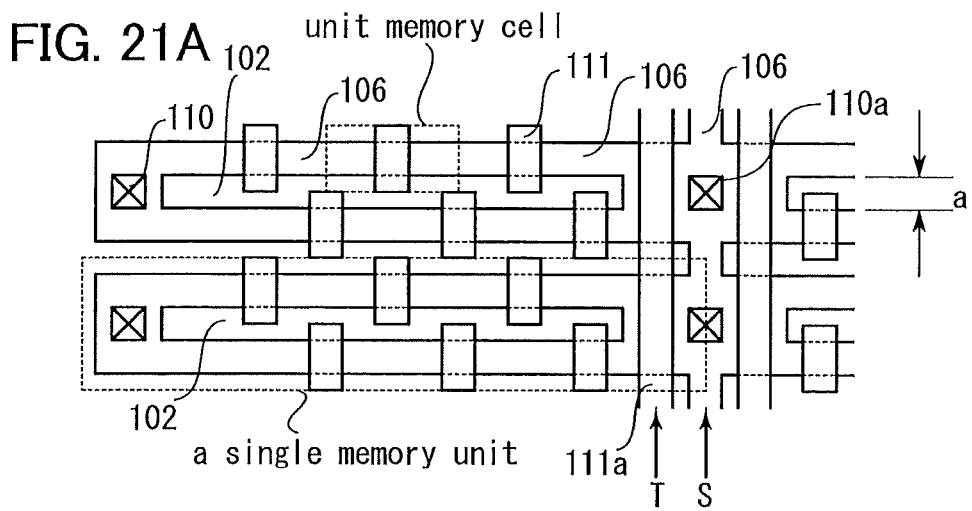
FIGS. 21A to 21C are diagrams illustrating an example of layout of wirings of a semiconductor memory device according to one embodiment of the present invention.
Figure 21B:
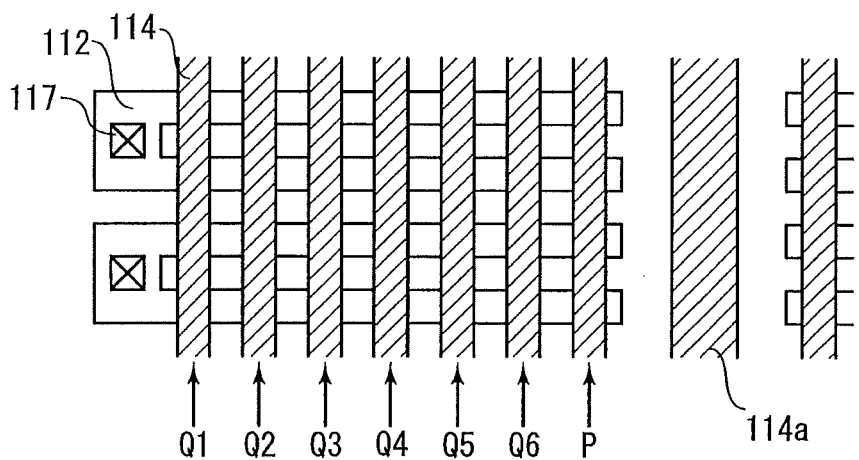
Figure 21C:
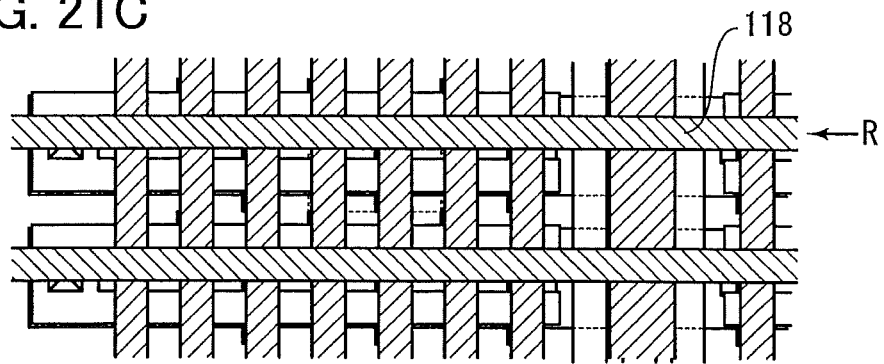

In this embodiment, a shape of the semiconductor memory device operation of which is described in Embodiment 9 will be described. An example of layout of a memory unit of the semiconductor memory device in this embodiment is illustrated in FIGS. 21A to 21C. In this embodiment, a single memory unit includes six memory cells. Although the pattern of a wiring of the semiconductor memory device in this embodiment is different from that in Embodiment 3, the semiconductor memory device in this embodiment can be manufactured by the method described in Embodiment 3.

In FIG. 21A, main wirings, main electrodes, and the like provided over a single crystal silicon substrate are illustrated. The element separation region 102 is formed over the substrate. Further, the conductive region 106 is formed using a conductive material or doped silicon. Part of the conductive region 106 serves as a source and a drain of the reading transistor. Further, another part of the conductive region 106 serves as part of the bias line S. Some portions of the conductive region 106 are separated from each other by the gate electrode 111 or a gate electrode 111a of the reading transistor.

Note that the gate electrode 111a serves as a gate electrode of a selection transistor and forms the selection line T. The gate electrode 111 and the gate electrode 111a are preferably formed using the same material at the same time.

The connection electrode 110 and a connection electrode 110a are provided in part of the conductive region 106. As materials for the gate electrodes 111 and 111a or the connection electrodes 110 and 110a, materials meeting the conditions of the gate electrodes 111 and 111a or the connection electrodes 110 and 110a described in Embodiment 3 may be used. In this embodiment, the gate electrodes 111 are provided alternately in a manner similar to that of Embodiment 5. As a result, the gate electrodes 111 can be provided more densely as compared with FIG. 20A. Therefore, an area per unit memory cell can be $8F^2$.

Figure 17B:
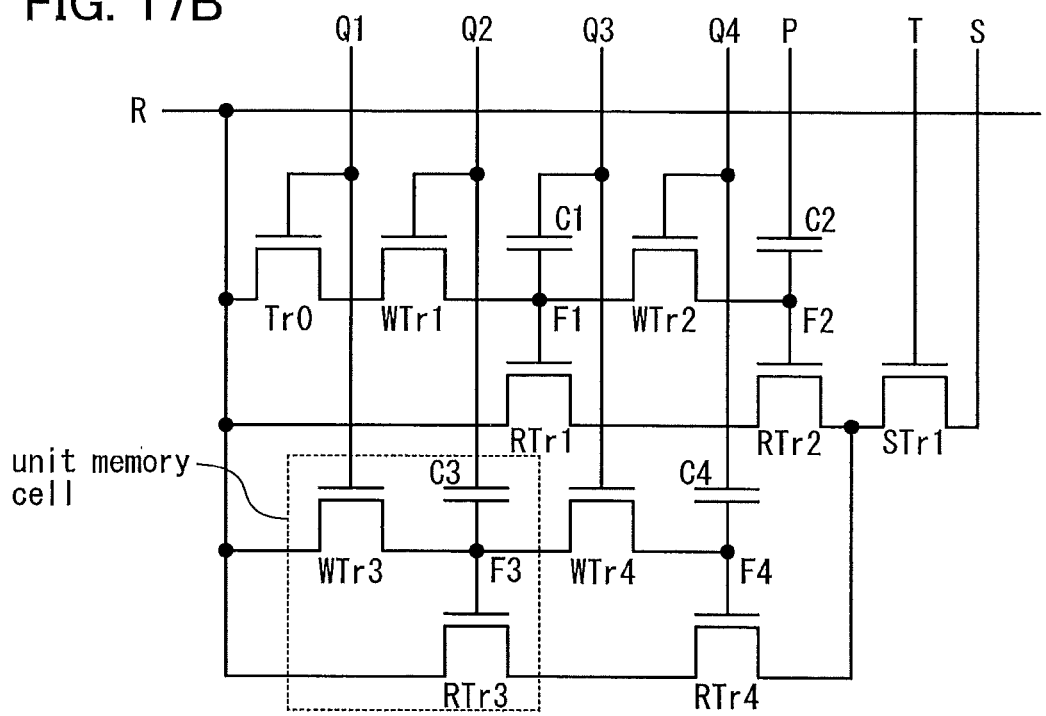

The selection transistor has the same structure as that illustrated in FIG. 17B in which one memory unit includes one selection transistor. Therefore, the width of the conductive region 106 near the selection transistor can be expanded and the connection electrode 110a can be provided in the conductive region 106.

Main wirings, main electrodes, and the like, focusing on the transistor including an oxide semiconductor, which is formed over the circuit illustrated in FIG. 21A, are illustrated in FIG. 21B. A plurality of island-shaped oxide semiconductor regions 112, a plurality of wirings 114, and a wiring 114a are formed. The wirings 114 serve as the writing word lines Q1, Q2, Q3, Q4, Q5, and Q6 and the reading word line P. The wiring 114a and the wiring 114 are formed using the same material at the same time. The wiring 114a is part of the bias line S, and connected to the conductive region 106 through the connection electrode 110a.

As seen from FIG. 20B, in this layer in the vicinity of the selection line T, there is no wiring or the like which is particularly needed. On the other hand, the bias line S is formed using the conductive region 106 in Embodiment 8, and has a lower conductivity than a metal wiring. Therefore, it is preferable that the bias line S be formed using not only the conductive region 106 but also a metal wiring.

In FIG. 20A, however, in order to provide a connection electrode which connects the conductive region 106 and a metal wiring formed over the conductive region 106, the width of the conductive region (a length in the channel length direction) needs to be further expanded. As a result, the integration degree is decreased.

In this embodiment, since one selection transistor is provided in one memory unit and thus the width of the conductive region 106 in the vicinity of the selection transistor can be sufficiently expanded, the connection electrode 110a can be provided in the conductive region 106. Then, the wiring 114a connecting to the connection electrode 110a can be provided.

As described above, there is no wiring or the like which is particularly needed in this portion, the width of the wiring 114a can be expanded. For example, the width may be twice the minimum feature size. When a line width is expanded, resistance of a wiring can be reduced. The width can be expanded more, but in that case, the wiring 114a overlaps with the gate electrode 111a of the selection transistor provided thereunder; thus, parasitic capacitance therebetween becomes large.

Part of the wiring 114 overlaps with the oxide semiconductor and serves as the gate electrode of the writing transistor. The oxide semiconductor region 112 is in contact with the gate electrode 111 provided thereunder. Further, a capacitor is formed in a portion where part of the wiring 114 overlaps with the gate electrode 111. The connection electrode 117 for connecting to an upper layer (e.g., the bit line R) is provided in the oxide semiconductor region 112.

FIG. 21C illustrates a structure where the structure illustrated in FIG. 21A overlaps with the structure illustrated in FIG. 21B. In FIG. 21C, the structures are shifted a little from each other so as to see the overlap. Further, the wiring 118 formed over the transistor including an oxide semiconductor is also illustrated. The wiring 118 serves as the bit line R.

As described above, the area per memory cell is 8 $F^2$. The memory unit includes a portion shared by the memory cells, so that the area per memory cell is actually greater than 8 $F^2$. The memory unit illustrated in FIGS. 21A to 21C are provided with six memory cells; as the number of memory cells in a memory unit is increased, the area per memory cell becomes close to 8 $F^2$.

(Embodiment 11)

In this embodiment, electronic appliances including any of the semiconductor memory devices described in Embodiments 1 to 5 will be described. Such semiconductor memory devices can be applied to appliances such as personal computers, portable communication devices, image display devices, and e-book readers.

This application is based on Japanese Patent Application serial no. 2010-088240 filed with Japan Patent Office on Apr. 7, 2010 and Japanese Patent Application serial no. 2010-092709 filed with Japan Patent Office on Apr. 14, 2010, the entire contents of which are hereby incorporated by reference.

The invention claimed is:

1. A semiconductor memory device comprising:
a first wiring;
a second wiring;
a third wiring;
a fourth wiring;
a fifth wiring; and
a memory unit comprising:
   a first memory cell;
   a second memory cell;
   a third memory cell; and
   a fourth memory cell,
wherein the first to fourth wirings are parallel to one another,
wherein the first wiring and the fifth wiring are orthogonal to each other,
wherein the first memory cell comprises a first transistor, a second transistor, and a first capacitor,
wherein the second memory cell comprises a third transistor, a fourth transistor, and a second capacitor,
wherein the third memory cell comprises a fifth transistor, a sixth transistor, and a third capacitor,
wherein the fourth memory cell comprises a seventh transistor, an eighth transistor, and a fourth capacitor,
wherein a drain of the first transistor is electrically connected to a gate of the second transistor and one electrode of the first capacitor,
wherein a drain of the third transistor is electrically connected to a gate of the fourth transistor and one electrode of the second capacitor,
wherein a drain of the fifth transistor is electrically connected to a gate of the sixth transistor and one electrode of the third capacitor,
wherein a drain of the seventh transistor is electrically connected to a gate of the eighth transistor and one electrode of the fourth capacitor,
wherein a gate of the fifth transistor is electrically connected to the first wiring,
wherein a gate of the first transistor and the other electrode of the third capacitor are electrically connected to the second wiring,
wherein the other electrode of the first capacitor and a gate of the seventh transistor are electrically connected to the third wiring,
wherein a gate of the third transistor and the other electrode of the fourth capacitor are electrically connected to the fourth wiring,
wherein the drain of the first transistor is electrically connected to a source of the third transistor,
wherein a drain of the second transistor is electrically connected to a source of the fourth transistor,
wherein the drain of the fifth transistor is electrically connected to a source of the seventh transistor,
wherein a drain of the sixth transistor is electrically connected to a source of the eighth transistor,
wherein the first transistor, the third transistor, the fifth transistor, and the seventh transistor have the same conductivity type,
wherein the second transistor, the fourth transistor, the sixth transistor, and the eighth transistor have the same conductivity type, and
wherein the conductivity type of the first transistor is different from the conductivity type of the second transistor.

2. The semiconductor memory device according to claim 1, wherein the conductivity type of the second transistor is p-type.

3. The semiconductor memory device according to claim 1, further comprising a ninth transistor,
wherein a source of the first transistor is electrically connected to a drain of the ninth transistor,
wherein a source of the ninth transistor is electrically connected to the fifth wiring, and
wherein a gate of the ninth transistor is electrically connected to the first wiring.

4. A semiconductor memory device comprising:
a first wiring;
a second wiring;
a third wiring;
a fourth wiring;
a fifth wiring; and
a memory unit comprising:
   a first memory cell;
   a second memory cell;
   a third memory cell; and
   a fourth memory cell,
wherein the first to fourth wirings are parallel to one another,
wherein the first wiring and the fifth wiring are orthogonal to each other,
wherein the first memory cell comprises a first transistor, a second transistor, and a first capacitor,
wherein the second memory cell comprises a third transistor, a fourth transistor, and a second capacitor, wherein the third memory cell comprises a fifth transistor, a sixth transistor, and a third capacitor, wherein the fourth memory cell comprises a seventh transistor, an eighth transistor, and a fourth capacitor, wherein a drain of the first transistor is electrically connected to a gate of the second transistor and one electrode of the first capacitor, wherein a drain of the third transistor is electrically connected to a gate of the fourth transistor and one electrode of the second capacitor, wherein a drain of the fifth transistor is electrically connected to a gate of the sixth transistor and one electrode of the third capacitor, wherein a drain of the seventh transistor is electrically connected to a gate of the eighth transistor and one electrode of the fourth capacitor, wherein a gate of the first transistor and the other electrode of the third capacitor are electrically connected to the first wiring, wherein the other electrode of the first capacitor and a gate of the seventh transistor are electrically connected to the second wiring, wherein a gate of the third transistor and the other electrode of the fourth capacitor are electrically connected to the third wiring, wherein the other electrode of the second capacitor is electrically connected to the fourth wiring, wherein the drain of the first transistor is electrically connected to a source of the third transistor, wherein a drain of the second transistor is electrically connected to a source of the fourth transistor, wherein the drain of the fifth transistor is electrically connected to a source of the seventh transistor, wherein a drain of the sixth transistor is electrically connected to a source of the eighth transistor, and wherein the first to eighth transistors have the same conductivity type.

5. The semiconductor memory device according to claim 4, wherein the conductivity type of the second transistor is n-type.

6. The semiconductor memory device according to claim 4, further comprising a ninth transistor, a tenth transistor, and a sixth wiring, wherein a drain of the fourth transistor is electrically connected to a source of the ninth transistor, wherein a drain of the eighth transistor is electrically connected to a source of the tenth transistor, wherein a gate of the ninth transistor and a gate of the tenth transistor are electrically connected to the sixth wiring, and wherein the sixth wiring is parallel to the first wiring.

* * * * *

UNITED STATES PATENT AND TRADEMARK OFFICE
CERTIFICATE OF CORRECTION

PATENT NO. : 8,472,231 B2
APPLICATION NO. : 13/076787
DATED : June 25, 2013
INVENTOR(S) : Yasuhiko Takemura It is certified that error appears in the above-identified patent and that said Letters Patent is hereby corrected as shown below:

In the Specification:

Column 3, line 17, after "preferably" replace "$1 \times 10^{-20}$" with --$1 \times 10^{-21}$--;

Column 6, line 8, replace "(m-1-th" with --($m$-1)-th--;

Column 6, line 10, replace "(m+1-th" with --($m$+1)-th--;

Column 6, line 11, replace "(m+2-th" with --($m$+2)-th--;

Column 6, line 12, replace "(n+1-th" with --($n$+1)-th--;

Column 6, line 12, replace "(m-1" with --($m$-1)--;

Column 6, line 13, replace "(n+1-th" with --($n$+1)-th--;

Column 6, line 14, replace "(n+1-th" with --($n$+1)-th--;

Column 6, line 14, replace "(m+1-th" with --($m$+1)-th--;

Column 6, line 15, replace "(n+1-th" with --($n$+1)-th--;

Column 6, line 15, replace "(m+2" with --($m$+2)--;

Column 6, line 19, replace "P3_22" with --P3_$n$--;

Column 10, line 29, replace "(m-1-th" with --($m$-1)-th--;

Column 10, line 31, replace "(m_1-th" with --($m$+1)-th--;

Column 10, line 32, replace "(n+2-th" with --($n$+1)-th--;

Column 10, line 33, replace "(n+1-th" with --($n$+1)-th--;

Signed and Sealed this
Twenty-fourth Day of September, 2013

Teresa Stanek Rea
*Deputy Director of the United States Patent and Trademark Office*

CERTIFICATE OF CORRECTION (continued)
U.S. Pat. No. 8,472,231 B2

Column 10, line 33, replace "(m-1" with --($m$-1)--;

Column 10, line 34, replace "(n+1-th" with --($n$+1)-th--;

Column 10, line 35, replace "(n+1-th" with --($n$+1)-th--;

Column 10, line 35, replace "(m+1-th" with --($m$+1)-th--;

Column 10, line 36, replace "(n+1-th" with --($n$+1)-th--;

Column 10, line 36, replace "(m+2" with --($m$+2)--;

Column 13, line 34, replace "farmed" with --formed--; and

Column 25, line 6, replace "$1 \times 10^{19}$" with --$1 \times 10^{-19}$--.